(12) United States Patent
Choi et al.

(10) Patent No.: US 8,766,232 B2
(45) Date of Patent: Jul. 1, 2014

(54) SEMICONDUCTOR MEMORY DEVICES HAVING VARIABLE RESISTOR AND METHODS OF FABRICATING THE SAME

(75) Inventors: Sukhun Choi, Suwon-si (KR); Boun Yoon, Seoul (KR); Kevin Ahn, Hwaseong-si (KR); Doo-Sung Yun, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 251 days.

(21) Appl. No.: 13/221,242

(22) Filed: Aug. 30, 2011

(65) Prior Publication Data
US 2012/0091422 A1 Apr. 19, 2012

(30) Foreign Application Priority Data
Oct. 14, 2010 (KR) ........................ 10-2010-0100466

(51) Int. Cl.
*H01L 47/00* (2006.01)
*H01L 27/24* (2006.01)
*H01L 45/00* (2006.01)

(52) U.S. Cl.
CPC ........ *H01L 27/2409* (2013.01); *H01L 27/2463* (2013.01); *H01L 27/2481* (2013.01); *H01L 45/06* (2013.01)
USPC ................... 257/4; 257/2; 257/107; 257/130; 257/155; 257/E45.315; 438/92; 438/95; 438/133; 438/243; 438/244

(58) Field of Classification Search
None
See application file for complete search history.

(56) References Cited

U.S. PATENT DOCUMENTS

| | | | |
|---|---|---|---|
| 8,384,061 B2 * | 2/2013 | Mikawa et al. | 257/4 |
| 2003/0214856 A1 * | 11/2003 | Pellizzer et al. | 365/200 |
| 2007/0080421 A1 * | 4/2007 | Lee et al. | 257/486 |
| 2010/0012915 A1 | 1/2010 | Yoon et al. | |
| 2010/0065805 A1 | 3/2010 | Park | |

FOREIGN PATENT DOCUMENTS

| | | | |
|---|---|---|---|
| JP | WO2009069252 | * | 6/2009 |
| KR | 20080099423 A | | 11/2008 |
| KR | 20100008883 A | | 1/2010 |
| KR | 20100032581 A | | 3/2010 |

* cited by examiner

*Primary Examiner* — Yasser A Abdelaziez
(74) *Attorney, Agent, or Firm* — Harness, Dickey & Pierce, P.L.C.

(57) ABSTRACT

According to a method of fabricating the semiconductor memory device, a contact plug can be protected while mold openings are formed. A semiconductor memory device may include a mold dielectric layer on an entire surface of a substrate, the substrate including a first region and a second region. A contact plug may be provided in a contact hole formed through the mold dielectric layer in the first region. A variable resistor may be provided in a mold opening formed through the mold dielectric layer in the second region. An upper surface of the contact plug may be at a level equal to or lower than an upper surface of the mold dielectric layer.

13 Claims, 31 Drawing Sheets

SEMICONDUCTOR MEMORY DEVICES HAVING VARIABLE RESISTOR AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2010-0100466, filed on Oct. 14, 2010, the entire contents of which are hereby incorporated by reference.

BACKGROUND

1. Field

Example embodiments relate to semiconductor memory devices and methods of fabricating the semiconductor memory devices, and more particularly, to semiconductor memory devices including variable resistors and methods of fabricating the semiconductor memory devices.

2. Description of the Related Art

Semiconductor devices are considered as important elements in the electronic industry owing to their small sizes, multi-functions, and/or low manufacturing costs. Semiconductor devices can be classified into semiconductor memory devices configured to store logic data, semiconductor logic devices configured to process logic data, and hybrid semiconductor devices including memory elements and logic elements. Dynamic random access memory (DRAM) devices, static random access memory (SRAM) devices, and flash memory devices are known as semiconductor memory devices.

With the trend towards higher speed operation and lower power consumption of electronic devices, semiconductor memory devices built into these electronic devices may be required to be faster in read/write operations and lower in operation voltage. Research has been conducted to develop new semiconductor memory devices satisfying such demands. As a result, phase change memory devices, resistive memory devices, and magnetic memory devices have been proposed. In addition, the highly-developed electronic industry requires more reliable semiconductor memory devices. However, as semiconductor memory devices are highly integrated, manufacturing reliable semiconductor memory devices may be more difficult. Thus, much research is being conducted to develop reliable semiconductor memory devices.

SUMMARY

Example embodiments provide a reliable semiconductor memory device including a variable resistor and a method of fabricating the semiconductor memory device. Example embodiments also provide a highly optimized and integrated semiconductor memory device including a variable resistor and a method of fabricating the semiconductor memory device.

Example embodiments of the inventive concepts provide a semiconductor memory device. The semiconductor memory device may include a mold dielectric layer on an entire surface of a substrate, the substrate including a first region and a second region, a contact plug in a contact hole formed through the mold dielectric layer in the first region, the contact plug having an upper surface at a level equal to or lower than an upper surface of the mold dielectric layer, and a variable resistor in a mold opening formed through the mold dielectric layer in the second region.

The upper surface of the contact plug may be at a level higher than a bottom surface of the mold dielectric layer. An upper surface of the variable resistor may be at a level substantially equal to or lower than the upper surface of the mold dielectric layer and higher than a bottom surface of the mold dielectric layer.

A lower interlayer dielectric layer may be between the mold dielectric layer and the substrate, and a lower electrode may be in a lower hole formed through the lower interlayer dielectric layer in the second region, wherein the variable resistor makes contact with an upper surface of the lower electrode, and wherein the contact hole extends downward to penetrate the lower interlayer dielectric layer in the first region, and the contact plug extends downward to fill a portion of the contact hole penetrating the lower interlayer dielectric layer.

A selective diode may be in the lower hole, and the lower electrode may be on the selective diode. An etch stop layer may be between the mold dielectric layer and the lower interlayer dielectric layer. The contact hole may be formed sequentially through the mold dielectric layer, the etch stop layer, and the lower interlayer dielectric layer in the first region, and the mold opening may be formed sequentially through the mold dielectric layer and the etch stop layer in the second region.

The contact plug may be a first contact plug. An upper interlayer dielectric layer may be on the mold dielectric layer; and a second contact plug may be formed through the upper interlayer dielectric layer in the first region, the second contact plug making contact with the upper surface of the first contact plug. The upper surface of the first contact plug may include a first portion making contact with the second contact plug and a second portion not making contact with the second contact plug. The first portion may be at a level lower than the second portion and the second portion may be at the same level as the upper surface of the mold dielectric layer.

The entire upper surface of the first contact plug may make contact with the second contact plug, and the entire upper surface of the first contact plug may be at a level lower than the upper surface of the mold dielectric layer. An upper electrode may be between an upper surface of the variable resistor and the upper interlayer dielectric layer in the second region, and a buried electrode may be in an upper opening formed through the upper interlayer dielectric layer in the second region, the buried electrode being connected to the upper electrode. The upper surface of the variable resistor may be at a level lower than the upper surface of the mold dielectric layer, and the upper electrode may extend to fill a portion of the mold opening higher than the upper surface of the variable resistor.

A capping pattern may be on a portion of the upper surface of the contact plug. The upper surface of the contact plug may be at a level lower than the upper surface of the mold dielectric layer, and an upper surface of the capping pattern may be at the same level as the upper surface of the mold dielectric layer. The capping pattern may include a metal oxide and the contact plug may include the same metal as that included in the capping pattern.

Example embodiments of the inventive concepts provide a semiconductor memory device. The semiconductor memory device may include a first mold dielectric layer on an entire surface of a substrate, the substrate including a first region and a second region, a contact plug in a contact hole formed through the first mold dielectric layer in the first region, a second mold dielectric layer on the first mold dielectric layer, and a variable resistor in a mold opening formed through the second mold dielectric layer and the first mold dielectric layer in the second region, the variable resistor having an upper surface at a level higher than an upper surface of the contact plug.

The upper surface of the contact plug may be at a level equal to or lower than an upper surface of the first mold dielectric layer. A lower interlayer dielectric layer may be between the first mold dielectric layer and the substrate, and a lower electrode may be in a lower hole formed through the lower interlayer dielectric layer in the second region. The variable resistor may make contact with an upper surface of the lower electrode, and the contact hole may extend downward to penetrate the lower interlayer dielectric layer in the first region. The contact plug may extend downward to fill a portion of the contact hole penetrating the lower interlayer dielectric layer.

An etch stop layer may be between the first mold dielectric layer and the lower interlayer dielectric layer. The contact hole may be formed sequentially through the first mold dielectric layer, the etch stop layer, and the lower interlayer dielectric layer in the first region. The mold opening may be formed sequentially through the second mold dielectric layer, the first mold dielectric layer, and the etch stop layer in the second region.

The contact plug may be a first contact plug and the contact hole may be a first contact hole. An upper interlayer dielectric layer may be on the second mold dielectric layer, and a second contact plug may be in a second contact hole formed sequentially through the upper interlayer dielectric layer and the second mold dielectric layer in the first region, the second contact plug making contact with the upper surface of the first contact plug. An upper electrode may be between the upper surface of the variable resistor and the upper interlayer dielectric layer in the second region, and a buried electrode may be in an upper opening formed through the upper interlayer dielectric layer in the second region, the buried electrode being connected to the upper electrode.

Example embodiments of the inventive concepts provide a method of fabricating a semiconductor memory device. The method may include forming a mold dielectric layer on an entire surface of a substrate, the substrate including a first region and a second region, etching the mold dielectric layer in the first region to form a contact hole, forming a contact plug in the contact hole, forming a capping pattern on the contact plug by performing a surface treatment process on the substrate, etching the mold dielectric layer in the second region of the substrate to form a mold opening after the forming the capping pattern, and forming a variable resistor in the mold opening.

After the forming the capping pattern, the forming the mold opening may further include forming a mask pattern defining the mold opening on the mold dielectric layer formed on the substrate. The etching the mold dielectric layer may be performed using the mask pattern as an etch mask, and the mask pattern may be removed. After removing the mask pattern, a post etching process may be performed on the mold opening. The surface treatment process may be an oxidation process. The contact plug may include a metal, and the capping pattern may include a metal oxide containing the metal.

The capping pattern may protrude above an upper surface of the mold dielectric layer. After the capping pattern and the mold opening are formed, the forming the variable resistor may include forming a variable resistance material layer filling the mold opening over the entire surface of the substrate, and planarizing the variable resistance material layer and the capping pattern until the mold dielectric layer is exposed. The planarizing the variable resistance material layer and the capping pattern may include planarizing the variable resistance material layer and the capping pattern until upper surfaces of the mold dielectric layer and the contact plug are exposed.

The planarizing the variable resistance material layer and the capping pattern may include planarizing the variable resistance material layer and the capping pattern until the mold dielectric layer is exposed in order to form the variable resistor in the mold opening and a planarized capping pattern on the contact plug. Prior to forming the mold dielectric layer, a lower interlayer dielectric layer may be formed on the substrate. The lower interlayer dielectric layer may be patterned in the second region to form a lower hole through the lower interlayer dielectric layer. A selective diode may be formed in the lower hole, and a lower electrode may be formed in the lower hole and on the selective diode. An etch stop layer may be formed on the substrate including the lower electrode.

The mold dielectric layer, the etch stop layer, and the lower interlayer dielectric layer may be patterned in sequential order to form the contact hole in the first region, and the mold dielectric layer and the etch stop layer may be patterned in sequential order to form the mold opening in the second region.

Example embodiments of the inventive concepts provide a semiconductor memory device. The semiconductor memory device may include a mold dielectric layer on an entire surface of a substrate, the substrate including a first region and a second region, a contact plug in the mold dielectric layer in the first region, the contact plug having an upper surface at a level equal to or lower than an upper surface of the mold dielectric layer, a capping pattern on a portion of the upper surface of the contact plug, the capping pattern having an upper surface at the same level as the upper surface of the mold dielectric layer, and a variable resistor in the mold dielectric layer in the second region.

The upper surface of the contact plug may be at a level higher than a bottom surface of the mold dielectric layer. An upper surface of the variable resistor may be at a level substantially equal to or lower than the upper surface of the mold dielectric layer and higher than a bottom surface of the mold dielectric layer. The contact plug may be a first contact plug, an upper interlayer dielectric layer may be on the mold dielectric layer, and a second contact plug may be formed through the upper interlayer dielectric layer in the first region, the second contact plug making contact with the upper surface of the first contact plug.

The upper surface of the first contact plug may include a first portion making contact with the second contact plug and a second portion not making contact with the second contact plug. The first portion may be at a level lower than the second portion and the second portion may be at the same level as the upper surface of the mold dielectric layer. The entire upper surface of the first contact plug may make contact with the second contact plug, and the entire upper surface of the first contact plug may be at a level lower than the upper surface of the mold dielectric layer. The capping pattern may include a metal oxide and the contact plug may include the same metal as that included in the capping pattern.

BRIEF DESCRIPTION OF THE DRAWINGS

The accompanying drawings are included to provide a further understanding of the inventive concepts, and are incorporated in and constitute a part of this specification. The drawings illustrate example embodiments of the inventive concepts and, together with the description, serve to explain principles of the inventive concepts. In the drawings.

DETAILED DESCRIPTION OF EXAMPLE EMBODIMENTS

Figure 1:
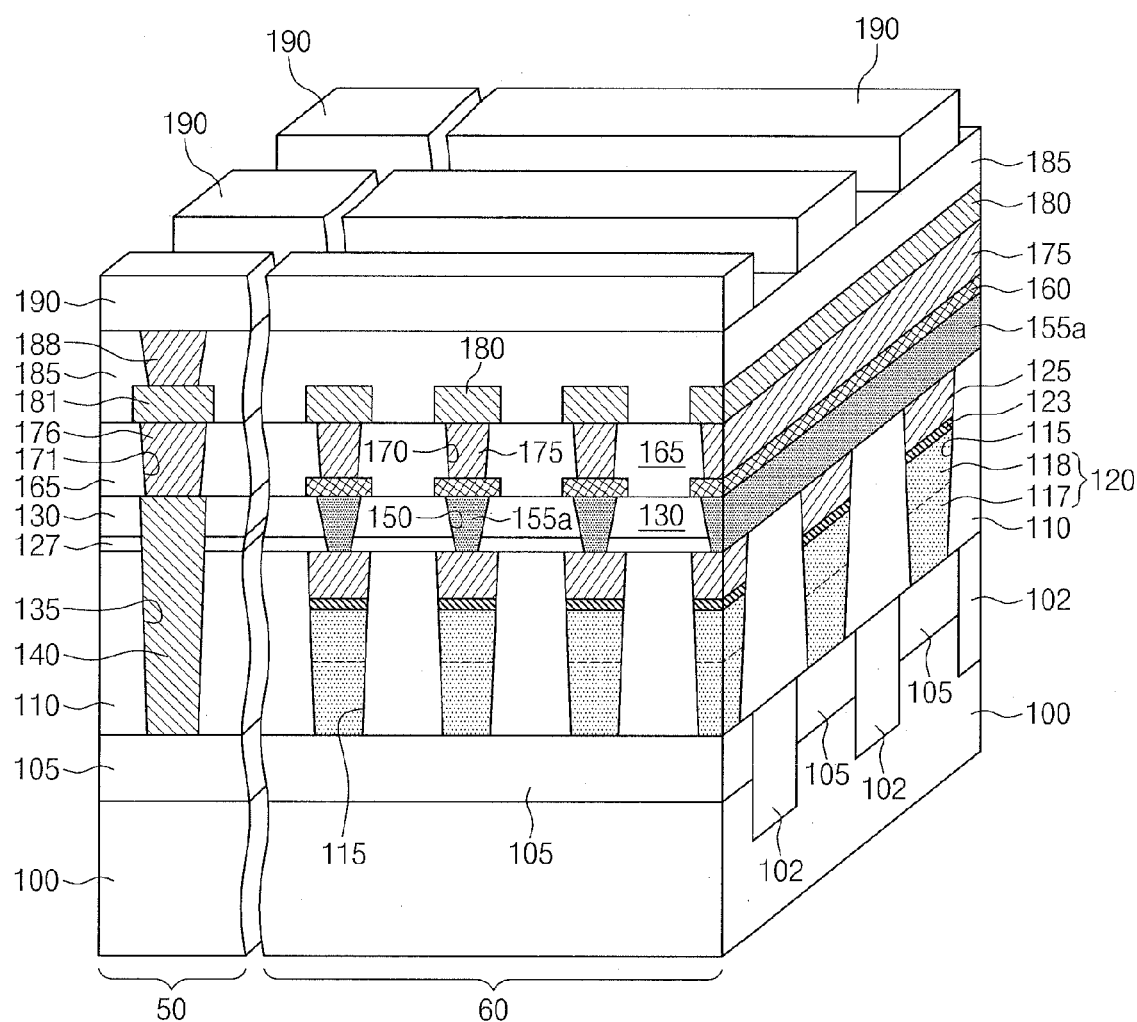
FIG. 1 is a perspective view illustrating a semiconductor memory device according to example embodiments of the inventive concepts.
Figure 1:
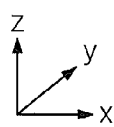

Example embodiments of the inventive concepts will be described below in more detail with reference to the accompanying drawings. The inventive concepts may, however, be embodied in different forms and should not be construed as limited to example embodiments set forth herein. Rather, these embodiments are provided so that this disclosure will be thorough and complete, and will fully convey the scope of the inventive concept to those skilled in the art.

It will also be understood that when a layer (or film) is referred to as being 'on' another layer or substrate, it can be directly on the other layer or substrate, or intervening layers may also be present. In the drawings, the thicknesses of layers and regions are exaggerated for clarity. Also, though terms like a first, a second, and a third are used to describe various regions and layers in various embodiments of the inventive concept, the regions and the layers are not limited to these terms.

These terms are used only to discriminate one region or layer (or film) from another region or layer. Therefore, a layer referred to as a first layer in one embodiment can be referred to as a second layer in another embodiment. An embodiment described and exemplified herein includes a complementary embodiment thereof. The expression 'and/or' is used to denote the case of including at least one of listed items. Like reference numerals refer to like elements throughout the specification.

Example embodiments will be described with reference to perspective views, cross-sectional views, and/or plan views, in which example embodiments are shown. Thus, the profile of an example view may be modified according to manufacturing techniques and/or allowances. That is, example embodiments are not intended to limit the scope of the inventive concepts but cover all changes and modifications that can be caused due to a change in manufacturing process. Thus, regions shown in the drawings are illustrated in schematic form and the shapes of the regions are presented simply by way of illustration and not as a limitation.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a perspective view illustrating a semiconductor memory device according to example embodiments of the inventive concepts. Referring to FIG. 1, a semiconductor substrate 100 (hereinafter referred to as a substrate 100) may include a first region 50 and a second region 60. The first region 50 and the second region 60 may be laterally arranged. The second region 60 may be a cell region where memory cells are arranged. Alternatively, the first region 50 may be another region. For example, the first region 50 may be a peripheral circuit region, a core region, and/or a strapping region. In example embodiments, the first region 50 may be a strapping region. In the following description, the first region 50 is a strapping region. However, example embodiments are not limited thereto. That is, the first region 50 may be any region of the semiconductor memory device except for the cell region. The substrate 100 may be formed of a semiconductor material. For example, the substrate 100 may be a silicon substrate, a germanium substrate, or a silicon-germanium substrate.

Device isolation patterns 102 may be disposed in the substrate 100 to define active portions. The active portions may be parts of the substrate 100 surrounded by the device isolation patterns 102. The active portions may be doped with a first conductive type dopant. The active portions may extend in a line shape along a first direction. The first direction may be an x-axis direction in FIG. 1. The active portions may extend laterally into the first region 50. The device isolation patterns 102 defining the active portions may also extend laterally into the first region 50.

Doped lines 105 may be disposed in the active portions, respectively. The doped lines 105 may be doped with a second conductive type dopant. The doped lines 105 may extend in the first direction as the active portions. One of the first and second conductive type dopants may be an n-type dopant, and the other may be a p-type dopant. In example embodiments, the active portions may be doped with a p-type dopant, and the doped lines 105 may be doped with an n-type dopant. In example embodiments, the doped lines 105 may be word lines.

A lower interlayer dielectric layer 110 may be disposed over the entire surface of the substrate 100. The lower interlayer dielectric layer 110 may include oxide, nitride, and/or oxynitride. A plurality of selective diodes 120 may be disposed within the lower interlayer dielectric layer 110 in the second region 60. The selective diodes 120 may be two-dimensionally arranged in the first direction and a second direction perpendicular to the first direction. That is, the selective diodes 120 may form a plurality of rows and a plurality of columns in a plan view. The rows may be parallel with the first direction, and the columns may be parallel with the second direction. The second direction may be a y-axis direction in FIG. 1. The selective diodes 120 may be disposed respectively in lower holes 115 penetrating the lower interlayer dielectric layer 110 in the second region 60. The selective diodes 120 may be electrically connected to the doped lines 105. For example, each of the selective diodes 120 may include a first doped portion 117 and a second doped portion 118 that are sequentially stacked.

The first doped portions 117 may make contact with upper surfaces of the doped lines 105. The first and second doped portions 117 and 118 may include a semiconductor material. In example embodiments, the first and second doped portions 117 and 118 may include the same semiconductor material as that included in the substrate 100. For example, the first and second doped portions 117 and 118 may include silicon, germanium, or silicon-germanium. The first doped portions 117 may be portions doped with the same type dopant (that is, the second conductive type dopant) as the dopant of the doped lines 105. The second doped portions 118 may be portions doped with a dopant (that is, the first conductive type dopant) different from the dopant of the first doped portions 117. Thus, the first and second doped portions 117 and 118 may make a PN junction, such that the selective diode 120 is formed by the first and second doped portions 117 and 118. Each of the doped lines 105 may be connected to a plurality of selective diodes 120.

Lower electrodes 125 may be disposed in the lower holes 115 above the selective diodes 120, respectively. The lower electrodes 125 may be electrically connected to upper portions of the selective diodes 120, respectively. The upper surfaces of the lower electrodes 125 may be substantially coplanar with the upper surface of the lower interlayer dielectric layer 110. In other words, a level of the upper surface of each of the lower electrodes 125 from the upper surface of the substrate 100 may be substantially equal to a level of the upper surface of the lower interlayer dielectric layer 110 from the upper surface of the substrate 100. The lower electrodes 125 may include a conductive material having relatively low reactivity. For example, the lower electrodes 125 may include a conductive metal nitride (for example, a titanium nitride, a tantalum nitride, and/or a titanium-aluminum nitride).

An ohmic pattern 123 may be disposed between each of the lower electrodes 125 and each of the selective diodes 120. The ohmic patterns 123 may be disposed in the lower holes 115, respectively. The lower electrodes 125 may make ohmic contact with the selective diodes 120 through the ohmic patterns 123. The ohmic patterns 123 may be formed of a metal-semiconductor compound. The ohmic patterns 123 may include the same semiconductor material as that included in the second doped portions 118 of the selective diodes 120. For example, the ohmic patterns 123 may include a cobalt-semiconductor compound (e.g., cobalt silicide), a nickel-semiconductor compound (e.g., nickel silicide), and/or a titanium-semiconductor compound (e.g., titanium silicide).

An etch stop layer 127 may be disposed over the entire surface of the substrate 100 including the lower interlayer dielectric layer 110, and a mold dielectric layer 130 may be disposed on the etch stop layer 127. The mold dielectric layer 130 may include oxide, nitride, or oxynitride. In example embodiments, the mold dielectric layer 130 may be a single layer. However, the inventive concepts are not limited thereto. In example embodiments, the mold dielectric layer 130 may include multiple layers. The etch stop layer 127 may include a dielectric material having etch selectivity to the mold dielectric layer 130. For example, if the mold dielectric layer 130 includes oxide, the etch stop layer 127 may include nitride or oxynitride.

First contact plugs 140 may be disposed in first contact holes 135, respectively. The first contact holes 135 may be formed sequentially through the mold dielectric layer 130, the etch stop layer 127, and the lower interlayer dielectric layer 110 in the first region 50. A level of the upper surfaces of the first contact plugs 140 from the upper surface of the substrate 100 may be substantially equal to or lower than a level of the upper surface of the mold dielectric layer 130 from the upper surface of the substrate 100. The upper surfaces of the first contact plugs 140 may be disposed at a level higher than the bottom surface of the mold dielectric layer 130. In the following description, the term level is used to denote a height from the upper surface of the substrate 100 in a z-axis direction.

In example embodiments, as shown in FIG. 1, the upper surfaces of the first contact plugs 140 may be disposed substantially at the same level as the upper surface of the mold dielectric layer 130. The first contact plugs 140 may include a metal. For example, the first contact plugs 140 may include tungsten, copper, or aluminum. In example embodiments, the first contact plugs 140 may include tungsten. Additionally, the first contact plugs 140 may further include a barrier layer and/or a glue layer. For example, the barrier layer may include a conductive metal nitride, e.g., titanium nitride and tantalum nitride. The glue layer may include titanium and/or tantalum.

In example embodiments, the first contact plugs 140 may be connected to the doped lines 105 extending into the first region 50. In example embodiments, the first region 50 may be a word line strapping region. The first contact plugs 140 disposed in the first region 50 may be connected to extensions of the doped lines 105, respectively. In example embodiments, the first contact plugs 140 may be arranged in a column along the second direction (refer to FIG. 3C).

However, the inventive concepts are not limited thereto. In example embodiments, the first region 50 may be strapping well regions. In example embodiments, the first contact plugs 140 may be electrically connected to the well regions formed in the substrate 100. Alternatively, the first region 50 may be a peripheral circuit region or a core region. In example embodiments, the first contact plugs 140 may be connected to terminals of devices farmed in the peripheral region or the core region. In the following description, the case where the first region 50 is a strapping region will be described as an example.

Referring to FIG. 1, variable resistors 155a may be disposed in the second region 60. The variable resistors 155a may be disposed in mold openings 150 formed through the mold dielectric layer 130 in the second region. The mold openings 150 may extend downward and penetrate the etch stop layer 127. The variable resistors 155a may make contact with the upper surfaces of the lower electrodes 125. The mold openings 150 may have a groove shape extending in the second direction. As a result, the variable resistors 155a may have a line shape extending in the second direction. Each of the variable resistors 155a may make contact with the lower electrodes 125 which are arranged in one column along the second direction. As described above, the lower electrodes 125 may be two-dimensionally arranged in the second region 60 to form a plurality of rows and a plurality of columns. Thus, each of the variable resistors 155a may make contact with the lower electrodes 125 arranged in each of the columns.

The upper surfaces of the variable resistors 155a may be disposed at a level substantially equal to or lower than the level of the upper surface of the mold dielectric layer 130. However, the upper surfaces of the variable resistors 155a may be higher than the bottom surface of the mold dielectric layer 130. In example embodiments, as shown in FIG. 1, the upper surfaces of the variable resistors 155a may be disposed substantially at the same level as the upper surface of the mold dielectric layer 130. The variable resistors 155a may be configured to be changed among a plurality of resistivity states which have resistivities different from each other. For example, the variable resistors 155a may include a phase change material. A width of the upper surface of the variable resistor 155a may be wider than that of the bottom surface of the variable resistor 155a. In other words, an area of the bottom surface of the variable resistor 155a may be smaller than that of the upper surface of the variable resistor 155a. Thus, a portion of the variable resistor 155a making contact with the lower electrode 125 may be included in a programming region. A phase of the program region may be changed during operation.

In example embodiments, an upper portion of the lower holes 115 may have a first width in the first direction, and a lower portion of the mold opening 150 may have a second width in the first direction. The first width of the lower holes 115 may be different from the second width of the mold opening 150. In example embodiments, the first width of the lower hole 115 may be greater than the second width of the mold opening 150.

The phase change material included in the variable resistors 155a may be a compound including at least one of tellurium (Te) and selenium (Se) (chalcogenide elements), and at least one of germanium (Ge), antimony (Sb), bismuth (Bi), lead (Pb), tin (Sn), silver (Ag), arsenic (As), sulfur (S), silicon (Si), phosphorus (P), oxygen (O), and nitrogen (N). For example, the variable resistors 155a may include at least one of Ge—Sb—Te, As—Sb—Te, As—Ge—Sb—Te, Sn—Sb—Te, Ag—In—Sb—Te, In—Sb—Te, Group 5A element-Sb—Te, Group 6A element-Sb—Te, Group 5A element-Sb—Se, and Group 6A element-Sb—Se.

Referring to FIG. 1, upper electrodes 160 may be disposed on the mold dielectric layer 130 in the second region 60. Each of the upper electrodes 160 may make contact with the upper surface of each of the variable resistor 155a. Like the variable resistors 155a, each of the upper electrodes 160 may have a line shape extending in the second direction. The upper electrodes 160 may make contact with the entire upper surfaces of the variable resistors 155a, respectively. The upper electrodes 160 may include a conductive material having relatively low reactivity. For example, the upper electrodes 160 may include a conductive metal nitride (for example, a titanium nitride, a tantalum nitride, and/or a titanium-aluminum nitride).

A first upper interlayer dielectric layer 165 may be disposed over the entire surface of the substrate 100 including the mold dielectric layer 130. The upper interlayer dielectric layer 165 may include oxide, nitride, and/or oxynitride. Second contact plugs 176 may be disposed in second contact holes 171 which are formed through the first upper interlayer dielectric layer 165 in the first region 50. The second contact plugs 176 may make contact with the upper surfaces of the first contact plugs 140, respectively. The second contact plugs 176 may be arranged in the second direction. The second contact plugs 176 may be spaced apart from each other.

In example embodiments, the second contact plug 176 may make partial contact with the upper surface of the first contact plug 140. For example, the upper surface of the first contact plug 140 may have a first portion contacting the second contact plug 176 and a second portion not contacting the second contact plug 176. In example embodiments, if there is sufficient etch selectivity between the first contact plug 140 and the first upper interlayer dielectric layer 165, as shown in FIG. 1, both the first and second portions of the upper surface of the first contact plugs 140 may be disposed substantially at the same level as the upper surface of the mold dielectric layer 130. Each of the second contact plugs 176 may include a metal. For example, each of the second contact plugs 176 may include tungsten, copper, or aluminum. Each of the second contact plugs 176 may further include a barrier layer and/or a glue layer. For example, the barrier layer in each of the second contact plugs 176 may include a conductive metal nitride, e.g., titanium nitride and/or tantalum nitride, and the glue layer in each of the second contact plugs 176 may include titanium and/or tantalum.

Buried electrodes 175 may be respectively disposed in upper openings 170 which are formed through the first upper interlayer dielectric layer 165 in the second region 60. The buried electrodes 175 may make contact with the upper electrodes 160, respectively. The upper openings 170 may have a groove shape extending in the second direction. As a result, the buried electrodes 175 may have a line shape extending in the second direction. The buried electrodes 175 may extend side by side in the second direction. The buried electrodes 175 may be formed of the same material as that used to form the second contact plugs 176.

A plurality of bit lines 180 may be disposed on the first upper interlayer dielectric layer 165 in the second region 60. The bit lines 180 may be connected to the upper surfaces of the buried electrodes 175, respectively. The bit lines 180 may extend in the second direction in parallel. As described above, according to example embodiments, the variable resistors 155a, the upper electrodes 160, the buried electrodes 175, and the bit lines 180 may extend in parallel with each other along the second direction. The bit lines 180 may include a metal. For example, the bit lines 180 may include tungsten, copper, or aluminum. In example embodiments, the bit lines 180 may include a metal having a resistivity lower than that of the buried electrodes 175. For example, the buried electrodes 175 may include tungsten, and the bit lines 180 may include aluminum.

Landing pads 181 may be disposed on the first upper interlayer dielectric layer 165 in the first region 50. The landing pads 181 may be disposed on the upper surfaces of the second contact plugs 176, respectively. The landing pads 181 may be arranged in the second direction. The landing pads 181 may be spaced apart from each other. The landing pads 181 may be formed of the same material as that used to form the bit lines 180.

A second upper interlayer dielectric layer 185 may be disposed on the bit lines 180, the landing pads 181, and the first upper interlayer dielectric layer 165. The second upper interlayer dielectric layer 185 may include oxide, nitride, and/or oxynitride. Third contact plugs 188 may penetrate the second upper interlayer dielectric layer 185 in the first region 50 and may be connected to the landing pads 181, respectively. The third contact plugs 188 may include a metal (e.g., tungsten, copper, or aluminum).

A plurality of strapping lines 190 may be disposed on the second upper interlayer dielectric layer 185 in the first region 50. The strapping lines 190 may be connected to the upper surfaces of the third contact plugs 188, respectively. Therefore, the strapping lines 190 may be connected to the doped lines 105, respectively. The strapping lines 190 may extend in parallel with the doped lines 105 (that is, in the first direction). The strapping lines 190 may laterally extend into the second region 60. The strapping lines 190 may include a metal having a resistivity lower than that of the doped lines 105. For example, the strapping lines 190 may include tungsten, copper, or aluminum.

As described above, according to example embodiments, the upper surfaces of the first contact plugs 140 and the upper surfaces of the variable resistors 155a may be disposed substantially at the same level as the upper surface of the mold dielectric layer 130 or a level lower than the upper surface of the mold dielectric layer 130. Therefore, a height difference between the first and second regions 50 and 60 can be minimized or reduced, and thus, the semiconductor memory device can be more reliable. In addition, a metal included in the first contact plugs 140 may not be included in the mold openings 150 and/or the variable resistors 155a. Therefore, the variable resistors 155a may operate more reliably.

Modification examples of example embodiments will be described with reference to the accompanying drawings. In the modification examples, the same elements as those described above will be denoted by the same reference numerals.

Figure 2A:
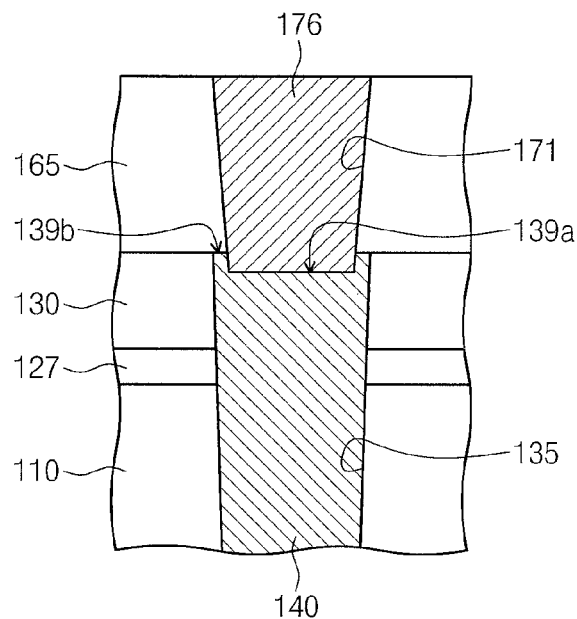
FIGS. 2A and 2B are enlarged views illustrating first and second contact plugs of a semiconductor memory device to explain modification examples of the semiconductor memory device of example embodiments of the inventive concepts.

FIG. 2A is an enlarged view illustrating first and second contact plugs 140 and 176 of a semiconductor memory device to explain a modification example of the semiconductor memory device of example embodiments.

Referring to FIG. 2A, as described above, the first contact plug 140 may make contact with the second contact plug 176 that penetrates a first upper interlayer dielectric layer 165. The first contact plug 140 may be disposed in a first contact hole 135, and the second contact plug may be disposed in a second contact hole 171, respectively. The first contact plug 140 may penetrate a mold dielectric layer 130, an etch stop layer 127, and a lower interlayer dielectric layer 110. The upper surface of the first contact plug 140 may include a first portion 139a making contact with the second contact plug 176 and a second portion 139b not making contact with the second contact plug 176.

In example embodiments, the first portion 139a of the upper surface of the first contact plug 140 may be disposed at a level lower than the second portion 139b. The first portion 139a of the upper surface of the first contact plug 140 may be disposed at a level lower than the upper surface of the mold dielectric layer 130, and the second portion 139b of the upper surface of the first contact plug 140 may be may be disposed substantially at the same level as the upper surface of the mold dielectric layer 130. The first portion 139a of the upper surface of the first contact plug 140 may be disposed on a level higher than the bottom surface of the mold dielectric layer 130.

Figure 2B:
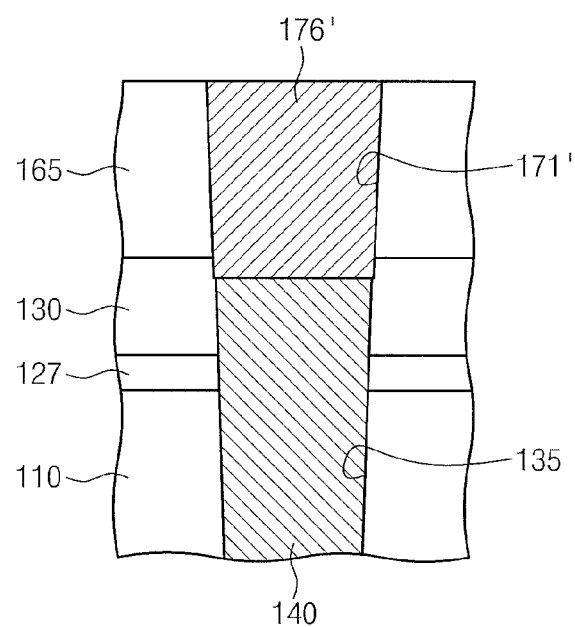

FIG. 2B is an enlarged view illustrating first and second contact plugs 140 and 176' of a semiconductor memory device to explain another modification example of the semiconductor memory device of example embodiments. Referring to FIG. 2B, as described above, the first contact plug 140 may be in a first contact hole 135 that penetrates a mold dielectric layer 130, an etch stop layer 127, and a lower interlayer dielectric layer 110. The second contact plug 176' may be disposed in a second contact hole 171' that penetrates a first upper interlayer dielectric layer 165. The second contact hole 171' may be wider than the first contact hole 135. Therefore, the second contact plug 176' may make contact with the entire upper surface of the first contact plug 140. In example embodiments, the entire upper surface of the first contact plug 140 may be disposed at a level lower than the upper surface of the mold dielectric layer 130.

In example embodiments, the upper surface of the first contact plug 140 may also be disposed at a level higher than the bottom surface of the mold dielectric layer 130. The second contact plug 176' may include the same material as that included in the second contact plug 176 of FIG. 1.

Figure 2C:
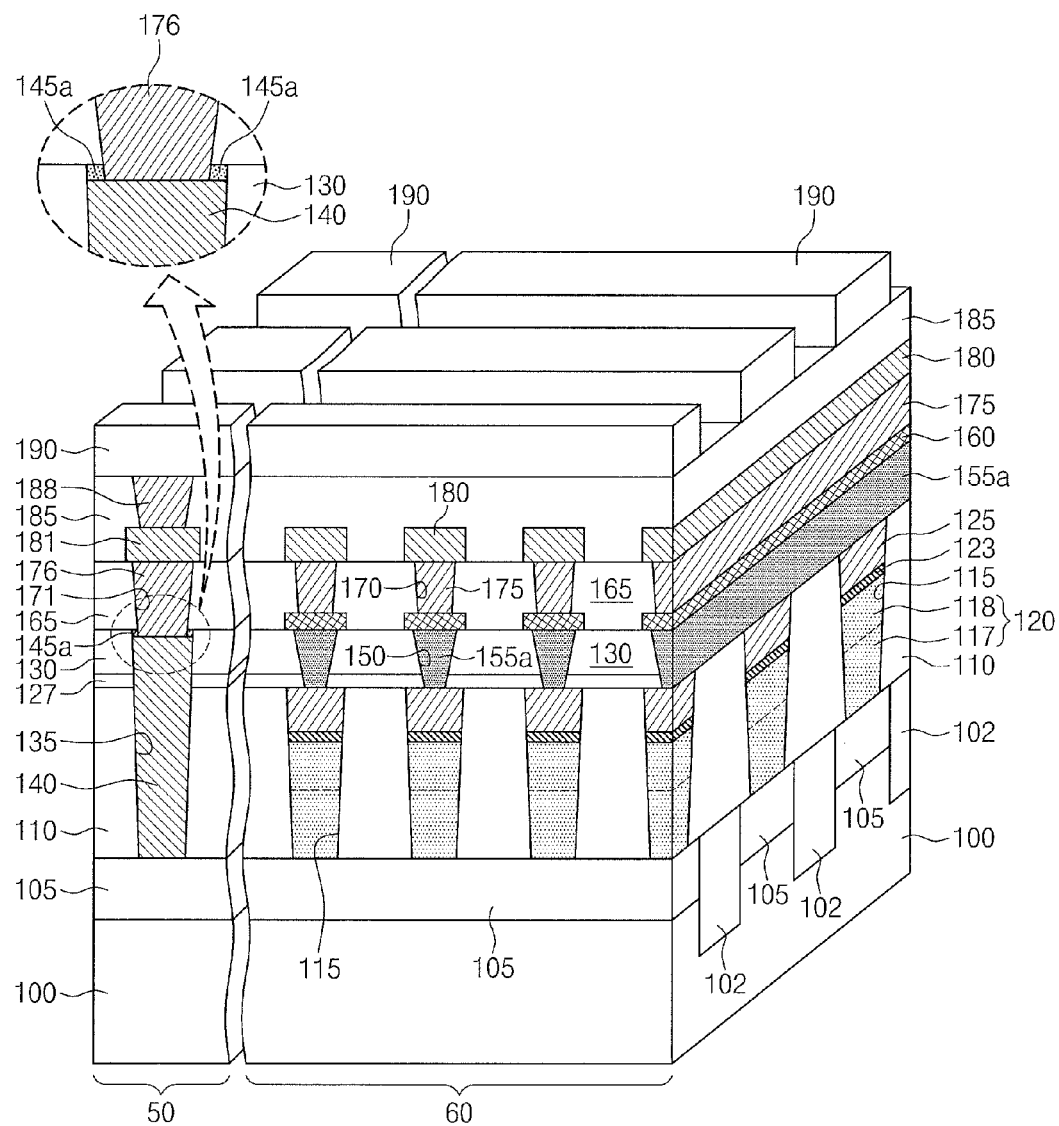
FIGS. 2C through 2E are perspective views illustrating modification examples of the semiconductor memory device of example embodiments of the inventive concepts.

FIG. 2C is a perspective view illustrating a modification example of the semiconductor memory device of example embodiments. Referring to FIG. 2C, capping patterns 145a may be disposed on portions of the upper surfaces of first contact plugs 140, respectively. Each of the capping patterns 145a may include a metal oxide, and the metal oxide may include the metal as that included in each of the first contact plugs 140. For example, if the first contact plugs 140 include tungsten, the capping patterns 145a may include tungsten oxide. In example embodiments, each of the capping patterns 145a may include a metal oxide which is formed by oxidizing the metal included in each of the first contact plugs 140.

Each of the capping patterns 145a may be disposed on a portion of the upper surface of each of the first contact plugs 140 which do not make contact with each of the second contact plugs 176. The upper surfaces of the capping patterns 145a may be disposed substantially at the same level as the upper surface of a mold dielectric layer 130. In example embodiments, the entire upper surface of the first contact plug 140 may be disposed at a level lower than the upper surface of the mold dielectric layer 130. In example embodiments, as described with reference to FIG. 2A, a first portion of the upper surface of the first contact plug 140 that makes contact with the second contact plug 176 may be disposed at a level lower than a second portion of the upper surface of the first contact plug 140 that is disposed under the capping patterns 145a.

Figure 2D:
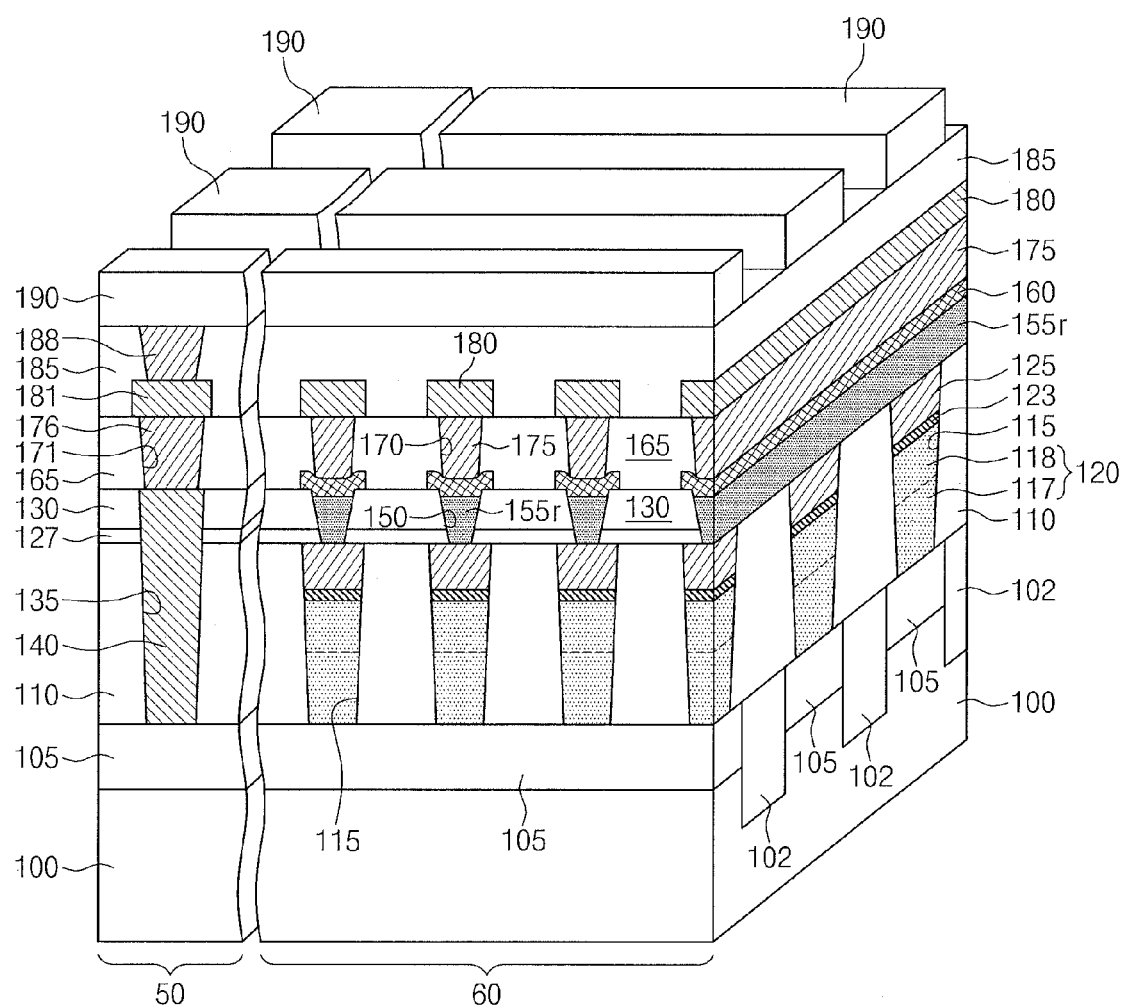

FIG. 2D is a perspective view illustrating another modification example of the semiconductor memory device of example embodiments. Referring to FIG. 2D, the upper surface of a variable resistor 155r may be disposed at a level lower than the upper surface of a mold dielectric layer 130. However, the upper surface of the variable resistor 155r may be disposed at a level higher than the bottom surface of the mold dielectric layer 130. The upper electrode 160 may extend to fill a portion of the mold opening 150 higher than the upper surface of the variable resistor 155r. Thus, the upper electrode 160 may make contact with the upper surface of the variable resistor 155r. The variable resistor 155r may be formed of the same material as that used to form the variable resistor 155a of FIG. 1.

In example embodiments, the upper surface of first contact plug 140 may be disposed substantially at the same level as the upper surface of the mold dielectric layer 130. However, the inventive concepts are not limited thereto. A contact structure including first and second contact plugs 140 and 176 of FIG. 2D may be replaced with a contact structure including the first and second contact plugs 140 and 176 of FIG. 2A, a contact structure including the first and second contact plugs 140 and 176' of FIG. 2B, or a contact structure including the first contact plug 140, the second contact plug 176, and the capping pattern 145a of FIG. 2C.

Figure 2E:
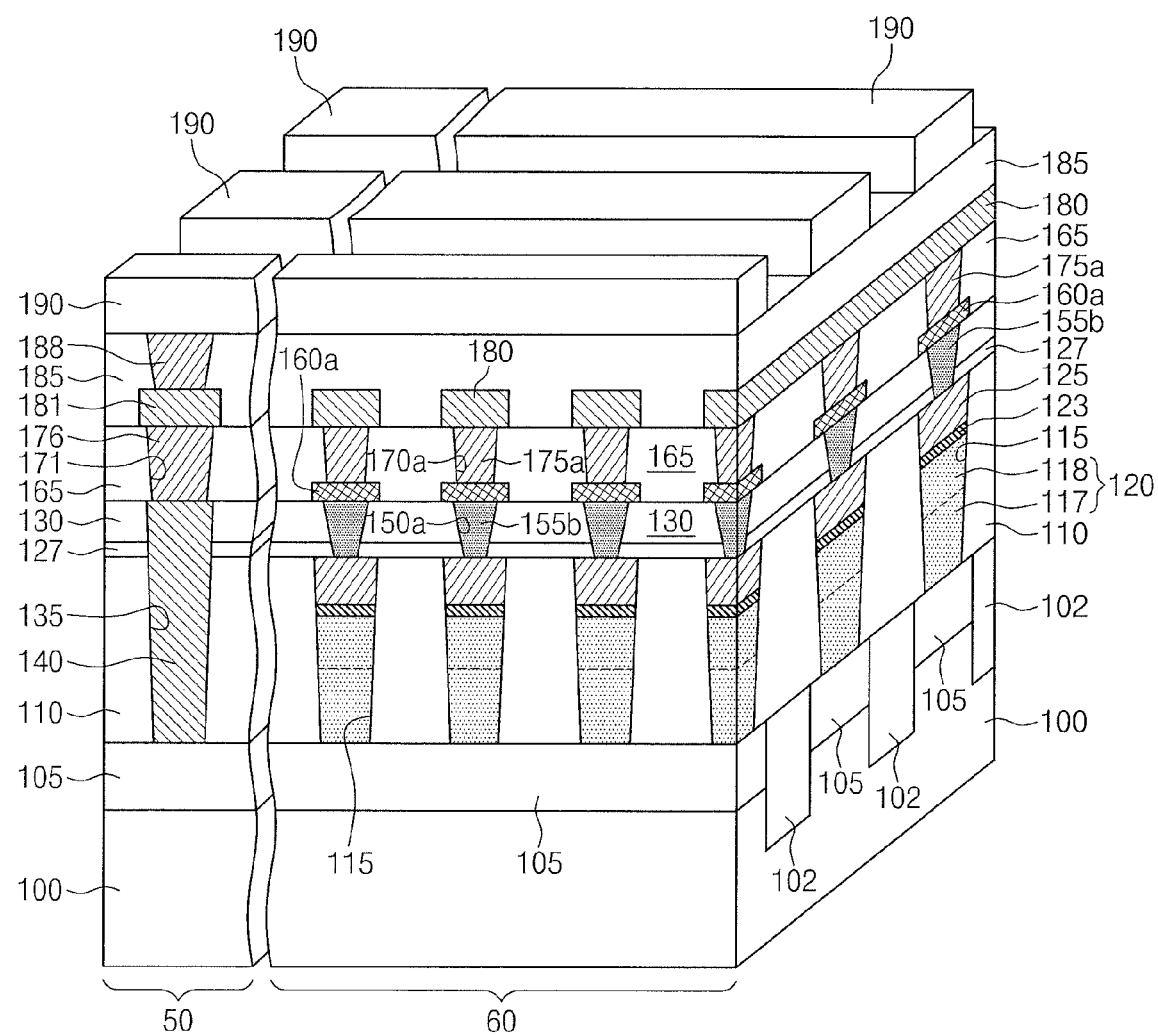

FIG. 2E is a perspective view illustrating still another modification example of the semiconductor memory device of example embodiments. Referring to FIG. 2E, a single lower electrode 125 may be exposed by a mold opening 150a. The mold opening 150a may be formed sequentially through a mold dielectric layer 130 and an etch stop layer 127. For example, the mold opening 150a may be formed as a hole shape. Therefore, a variable resistor 155b disposed in the mold opening 150a may make contact with the single lower electrode 125. That is, each of a plurality of the variable resistors 155b in the mold dielectric layer 130 and the etch stop layer 127 may make contact with each of a plurality of the lower electrodes 125, respectively. The variable resistors 155b may be two-dimensionally arranged in first and second directions in a plan view.

That is, the variable resistors 155b may form a plurality of rows and a plurality of columns in a plan view. The variable resistors 155b may be spaced apart from each other in the first and second directions. The first direction may be parallel with the rows, and the second direction may be parallel with the columns. The first direction may be an x-axis direction, and the second direction may be a y-axis direction in FIG. 2E. The upper surface of the variable resistor 155b may be wider than a bottom surface of the variable resistor 155b. Thus, a portion of the variable resistor 155a making contact with the lower electrode 125 may be a programming region.

Similarly, upper electrodes 160a may be disposed on the variable resistors 155b, respectively. The upper electrodes 160a may make contact with the upper surfaces of the variable resistors 155b, respectively. The upper electrodes 160a may be disposed under a first upper interlayer dielectric layer 165. Like the variable resistors 155b, the upper electrodes 160a may be two-dimensionally arranged to form rows and columns in a plan view. The upper electrodes 160a may be spaced apart from each other in the first and second directions.

Buried electrodes 175a may be formed through the first upper interlayer dielectric layer 165 and connected to the upper electrodes 160a, respectively. The buried electrodes 175a may be respectively disposed in upper openings 170a penetrating the first upper interlayer dielectric layer 165. The upper openings 170a may have a hole shape. The buried electrodes 175a may be two-dimensionally arranged to form rows and columns in a plan view. The buried electrodes 175a may be spaced apart from each other in the first and second directions.

Bit lines 180 may be disposed between the first upper interlayer dielectric layer 165 and a second upper interlayer dielectric layer 185, and each of the bit lines 180 may be electrically connected to a column of the buried electrodes 175a. The variable resistors 155b, the upper electrodes 160a, and the buried electrodes 175a may be formed of the same materials as those used to form the variable resistors 155a, the upper electrodes 160, and the buried electrodes 175 of FIG. 1.

In example embodiments, the variable resistors 155b may make contact with the upper electrodes 160a, respectively. Therefore, one variable resistor 155b may be confined in one memory cell. One of the technical ideas of the modification examples described with reference to FIGS. 2A through 2D may be applied to the modification example of FIG. 2E.

A method of fabricating a semiconductor memory device will be described according to example embodiments of the inventive concepts with reference to the accompanying drawings.

FIGS. 3A through 3J are perspective views for explaining a method of fabricating a semiconductor memory device according to example embodiments of the inventive concepts.

Figure 3A:
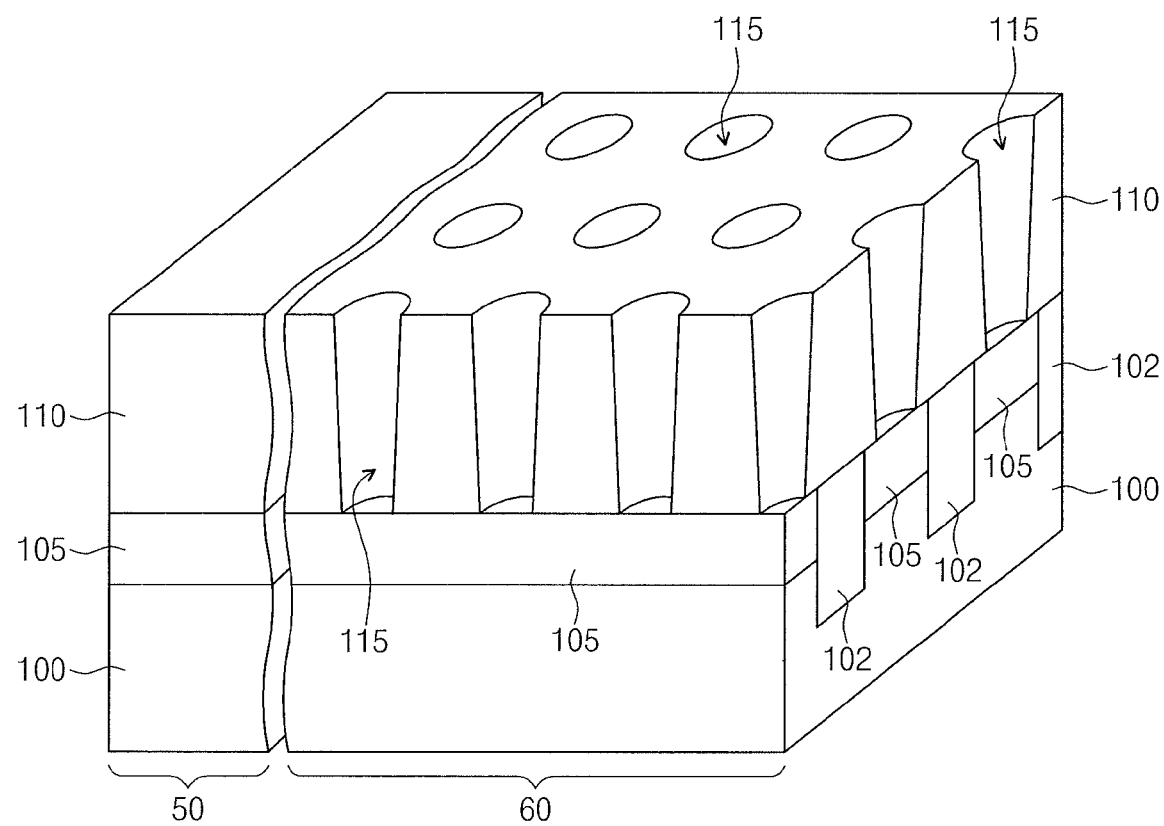
FIGS. 3A through 3J are perspective views for explaining a method of fabricating a semiconductor memory device according to example embodiments of the inventive concepts.

Referring to FIG. 3A, a substrate 100 including a first region 50 and a second region 60 is prepared. Device isolation patterns 102 may be formed in the substrate 100 to define active portions. The active portions may extend side by side in a first direction. The first direction may be an x-axis direction in FIG. 3A. The active portions may extend side by side into the first region 50. The active portions may be doped with a first conductive type dopant. For example, the active portions may be doped with the first conductive type dopant by forming a well region in the substrate 100 which is doped with the first conductive type dopant. The well region may be formed before or after the device isolation patterns 102 are formed.

A second conductive type dopant may be supplied to the active portions to form doped lines 105. The second conductive type dopant may be supplied to the respective active portions by an ion implanting method. The doped lines 105 may extend from the second region 60 into the first region 50.

A lower interlayer dielectric layer 110 may be formed over the entire surface of the substrate 100. The lower interlayer dielectric layer 110 may be an oxide layer, a nitride layer, and/or an oxynitride layer.

Lower holes 115 may be formed by patterning the lower interlayer dielectric layer 110 in the second region 60. The lower holes 115 may be arranged in the first direction and a second direction perpendicular to the first direction in a plan view. That is, the lower holes 115 may form a plurality of rows and a plurality of columns in a plan view. The first direction may be parallel with the rows, and the second direction may be parallel with the columns. The second direction may be a y-axis direction in FIG. 3A. Each of the doped lines 105 may be exposed by the lower holes 115 in each of the rows, and the lower holes 115 may be spaced apart from each other.

Figure 3B:
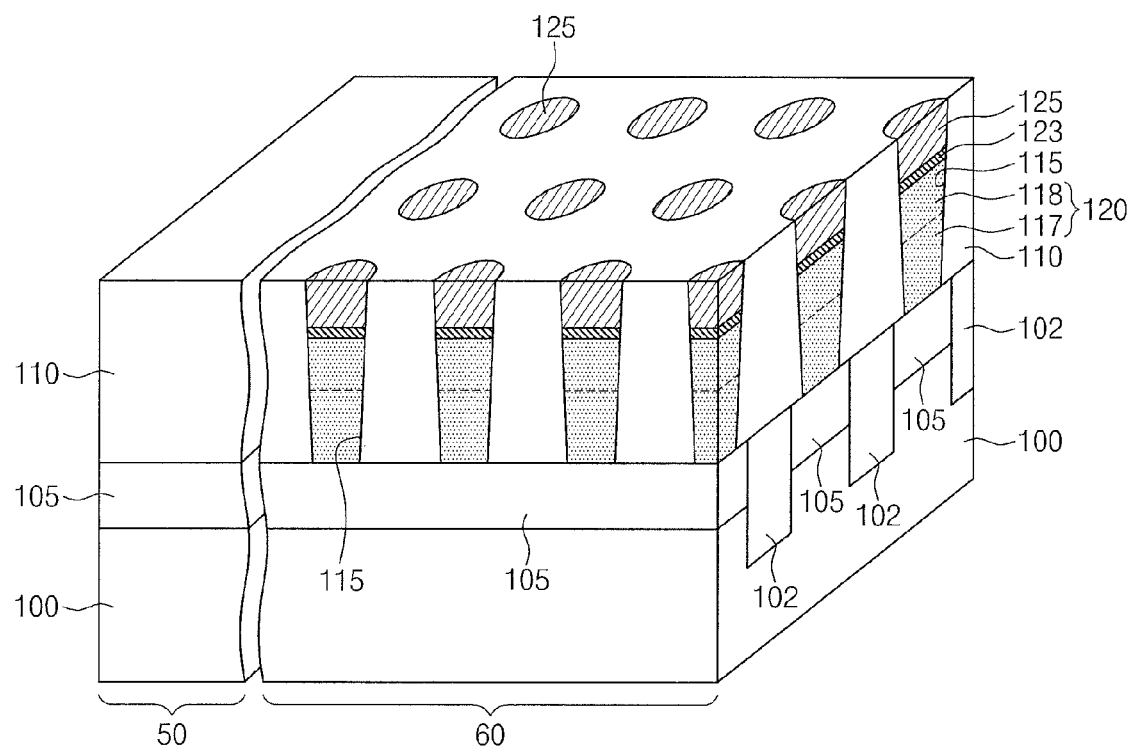
Figure 3B:
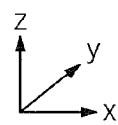

Referring to FIG. 3B, selective diodes 120 may be disposed in the lower holes 115, respectively. Each of the selective diodes 120 may include a first doped portion 117 and a second doped portion 118 that are sequentially stacked. The first doped portion 117 may be formed of a semiconductor doped with the same type dopant as the doped lines 105, and the second doped portion 118 may be formed of a semiconductor doped with a dopant different from the dopant of the first doped portions 117.

A method of forming the selective diodes 120 will now be described in detail. A semiconductor pattern may be formed in each of the lower holes 115. The upper surface of the semiconductor pattern may be lower than the upper surface of the lower interlayer dielectric layer 110. The semiconductor pattern may be formed of silicon, germanium, or silicon-germanium. In example embodiments, the semiconductor pattern may include the same semiconductor material as that of the substrate 100. The first doped portion 117 may be formed by doping a lower portion of the semiconductor pattern with the second conductive type dopant, and the second doped portion 118 may be formed by doping an upper portion of the semiconductor pattern with the first conductive type dopant. The first and second doped portions 117 and 118 may be formed by an ion implanting method or an in-situ method. In example embodiments, the semiconductor pattern may be formed by a selective epitaxial growth process using the doped lines 105 exposed by the lower hole 115 as a seed. The semiconductor pattern may be formed by the selective epitaxial process and a recess process.

Alternatively, an amorphous semiconductor layer may be formed above the substrate 100 to fill the lower hole 115. The amorphous semiconductor layer may make contact with the doped line 105 exposed by the lower hole 115. A heat treatment process may be performed on the amorphous semiconductor layer. The amorphous semiconductor layer making contact with the exposed doped line 105 may be changed into a crystalline semiconductor layer by the heat treatment process. A planarization process and a recess process may be performed on the crystalline semiconductor layer to form the semiconductor pattern having an upper surface lower than the upper surface of the lower interlayer dielectric layer 110.

An ohmic pattern 123 may be formed on the upper surface of each of the selective diodes 120. The ohmic pattern 123 may be formed by a metal-semiconductor reaction process (e.g., a silicidation process). For example, a metal layer making contact with the upper surface of each of the selective diodes 120 may be formed on the substrate 100, and a metal-semiconductor reaction process may be performed to cause the metal layer and the selective diode 120 to react with each other, such that the ohmic pattern 123 may be formed. After the ohmic patterns 123 are formed, the remaining metal layer which has not reacted with the selective diodes 120 may be removed. The metal layer may include nickel, titanium, and/or cobalt. The upper surface of the ohmic pattern 123 may be disposed at a level lower than the upper surface of the lower interlayer dielectric layer 110.

A lower electrode layer may be formed over the entire surface of the substrate 100 to fill portions of the lower holes 115 higher than the ohmic patterns 123, and the lower electrodes 125 may be formed by planarizing the lower electrode layer until the lower interlayer dielectric layer 110 is exposed. The lower electrodes 125 may be disposed in the lower holes 115 on the ohmic patterns 123, respectively. The upper surfaces of the lower electrodes 125 may be disposed substantially at the same level as the upper surface of the lower interlayer dielectric layer 110 by the planarization process.

Figure 3C:
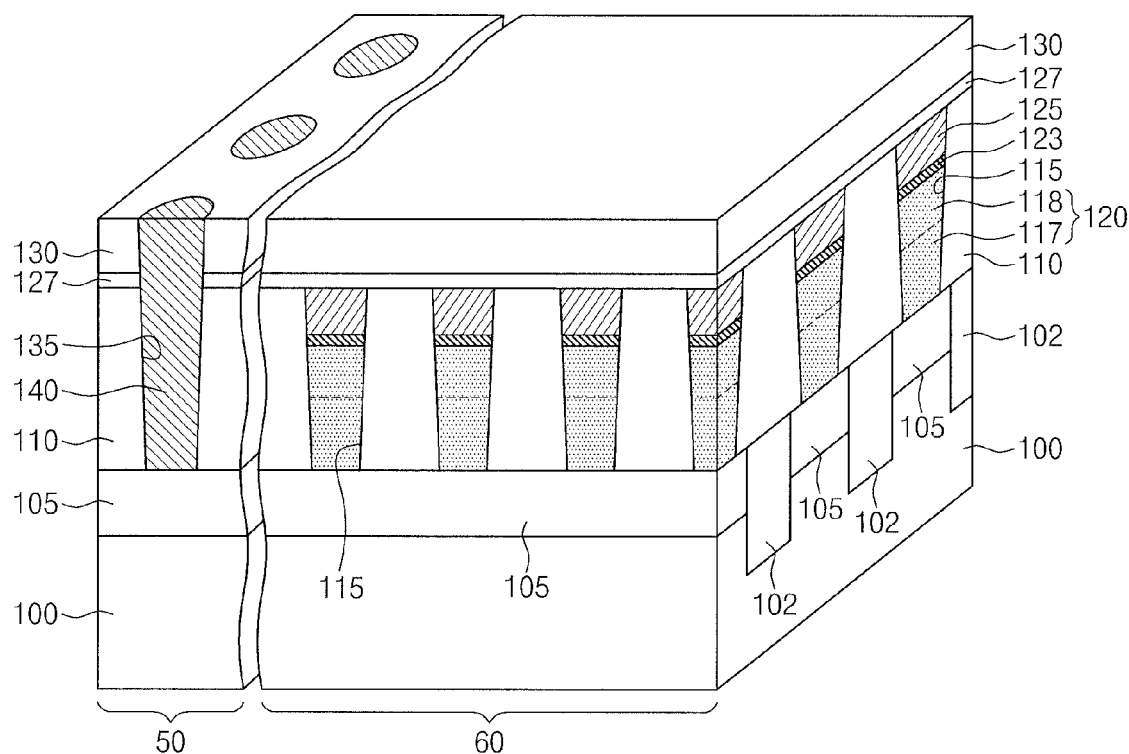
Figure 3C:
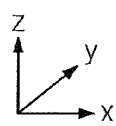

Referring to FIG. 3C, an etch stop layer 127 and a mold dielectric layer 130 may be sequentially formed over the substrate 100 including the lower electrodes 125. In example embodiments, the mold dielectric layer 130 may be an oxide layer. However, the inventive concepts are not limited thereto. The mold dielectric layer 130 may be formed of another material and/or have a multilayer structure. The etch stop layer 127 may include a dielectric material having etch selectivity with the mold dielectric layer 130. For example, if the mold dielectric layer 130 is an oxide layer, the etch stop layer 127 may be a nitride layer or an oxynitride layer.

First contact holes 135 may be formed sequentially through the mold dielectric layer 130, the etch stop layer 127, and the lower interlayer dielectric layer 110 in the first region 50. Extensions of the doped lines 105 disposed in the first region 50 may be respectively exposed by the first contact holes 135.

A first conductive layer may be formed over the entire surface of the substrate 100 to fill the first contact holes 135, and first contact plugs 140 may be respectively formed in the first contact holes 135 by planarizing the first conductive layer until the mold dielectric layer 130 is exposed. The upper surfaces of the first contact plugs 140 may be disposed substantially at the same level as the upper surface of the mold dielectric layer 130 by the planarization process. The first conductive layer may include a metal. For example, the first conductive layer may include a tungsten layer, a copper layer, or an aluminum layer. In addition, the conductive layer may further include a barrier layer (e.g., a conductive metal layer, for example, a titanium nitride layer and/or a tantalum nitride layer) under the metal layer and/or a glue layer (e.g., a titanium layer and/or a tantalum layer). The planarization process of the first conductive layer may be performed by a chemical mechanical polishing method or an etch-back method.

Figure 3D:
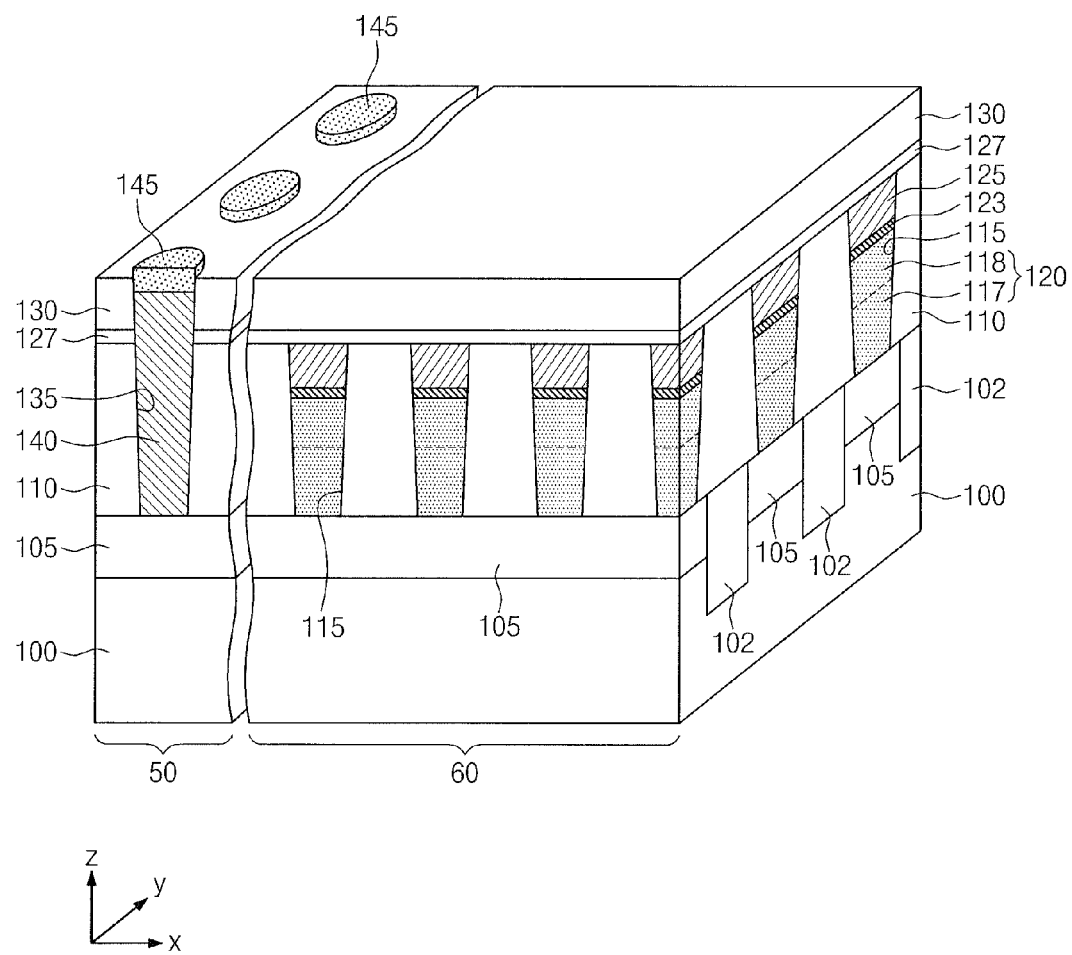

Referring to FIG. 3D, a surface treatment process may be performed on the substrate 100 including the first contact plugs 140 so as to form capping patterns 145 on the first contact plugs 140, respectively. In example embodiments, the surface treatment process may be an oxidation process. That is, the capping patterns 145 may be formed by oxidizing the first contact plugs 140. If the first contact plugs 140 include a metal as above described, the capping patterns 145 may include a metal oxide. For example, if the first contact plugs 140 include tungsten, the capping patterns 145 may include tungsten oxide. The capping patterns 145 may be formed only on the first contact plugs 140 by the surface treatment process. In other words, the capping patterns 145 are formed on the first contact plugs 140 but not on the mold dielectric layer 130.

The upper surfaces of the capping patterns 145 may be disposed at a level higher than the upper surface of the mold dielectric layer 130. That is, the capping patterns 145 may include portions protruding above the upper surface of the mold dielectric layer 130. In example embodiments, the bottom surfaces of the capping patterns 145 may be disposed at a level lower than the upper surface of the mold dielectric layer 130. In example embodiments, the surface treatment process may be a rapid thermal oxidation process, a plasma oxidation process, and/or a radical oxidation process.

In example embodiments, if the first contact plugs 140 include tungsten and the surface treatment process is a rapid thermal oxidation process, the surface treatment process may be performed at a process temperature of about 400° C. to about 700° C. for about 1 minute to about 10 minutes. If the surface treatment process is a plasma oxidation process, the surface treatment process may be performed under a power condition of about 20 W to about 1000 W for about 1 minute to about 10 minutes. However, the inventive concepts are not limited thereto. That is, the surface treatment process may be performed at another process temperature and/or for a different process time.

Figure 3E:
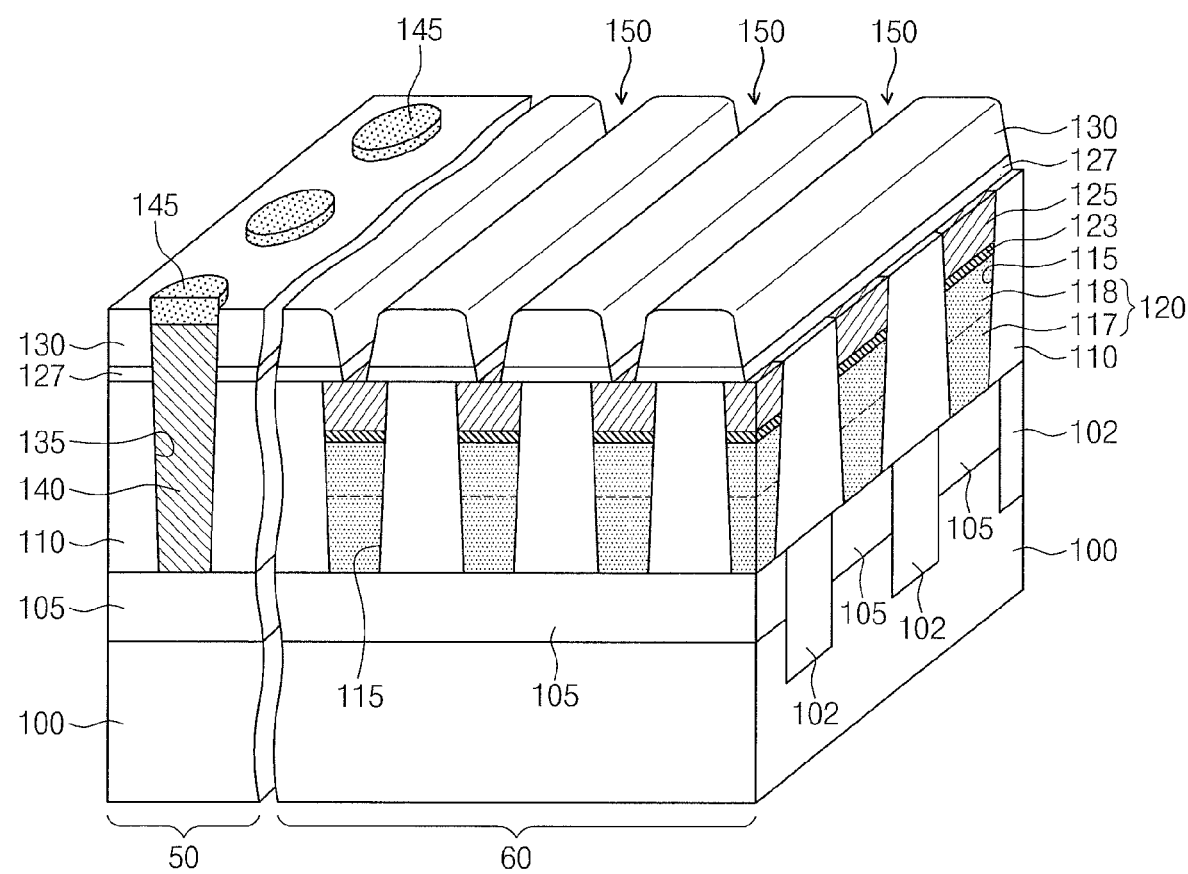

Referring to FIG. 3E, after forming the capping patterns 145, mold openings 150 may be formed in the second region 60 of the substrate 100. The mold opening 150 may be sequentially formed through the mold dielectric layer 130 and the etch stop layer 127 in the second region 60. The mold openings 150 may have a groove shape extending in the second direction. The lower electrodes 125 in each of the columns may be exposed by each of the mold openings 150.

Figure 4:
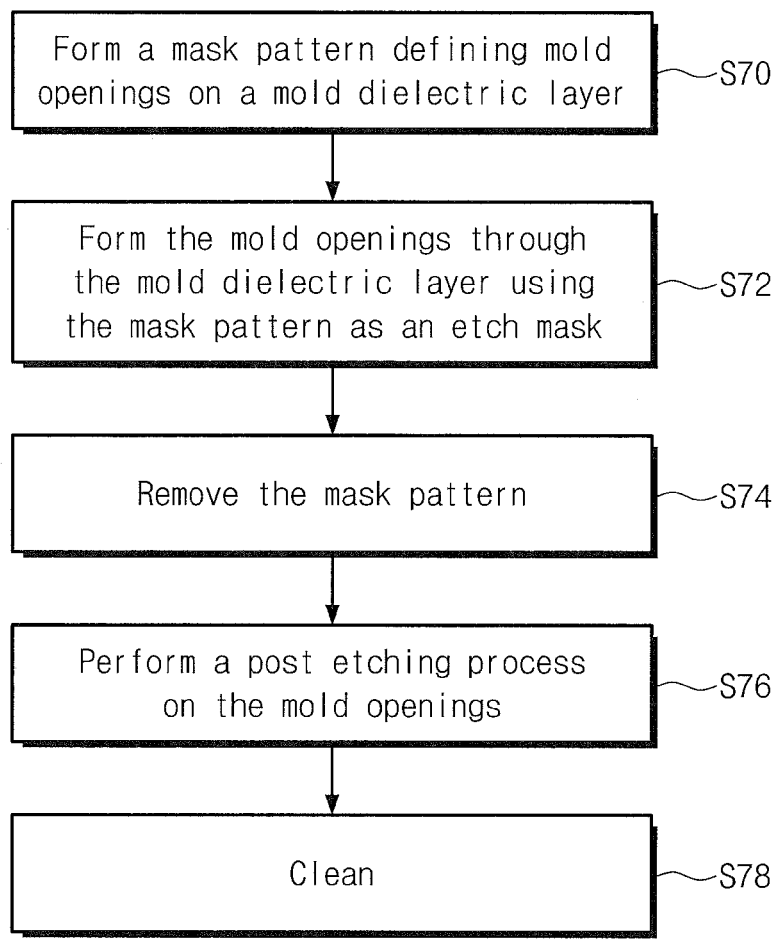
FIG. 4 is a flowchart for explaining a method of forming mold openings in which variable resistors will be disposed in the method of fabricating a semiconductor memory device according to example embodiments of the inventive concepts.

A method of forming the mold openings 150 will be described according to example embodiments with reference to a flowchart of FIG. 4. FIG. 4 is a flowchart for explaining a method of forming mold openings in which variable resistors will be disposed in the method of fabricating a semiconductor memory device according to example embodiments.

Referring to FIGS. 3E and 4, a mask pattern (not shown) defining the mold openings 150 may be formed above the substrate 100 including the capping patterns 145 (S70). The mask pattern may include a photoresist material. A portion of the mold dielectric layer 130 disposed in the second region 60 may be etched by using the mask pattern as an etch mask so as to form the mold openings 150 through the mold dielectric layer 130 (S72). In example embodiments, at least a portion of the etch stop layer 127 under each of the mold opening 150 may remain after the step S72. The mold opening 150 formed by the step S72 may have an upper width greater than a lower width of the mold opening 150. The mask pattern may be removed (S74). Therefore, the mold dielectric layer 130 disposed in the second region 60 may be exposed.

After the mask pattern is removed (S74), a post etching process may be performed on the mold openings 150 (S76). Upper portions of the mold openings 150 close to the upper surface of the mold dielectric layer 130 may be further etched through the post etching process. As a result, the upper width of the mold opening 150 penetrating the mold dielectric layer 130 may become much greater than the lower width of the mold opening 150. Therefore, a variable resistance material layer will be easily filled in the mold openings 150 in a later process. In addition, the portions of the etch stop layer 127 remaining under the mold openings 150 may be removed through the post etching process, and thus the lower electrodes 125 may be exposed.

The mold openings 150 may be formed through the mold dielectric layer 130 and the etch stop layer 127. However, the inventive concepts are not limited thereto. In example embodiments, in the step S72, the mold openings 150 may be formed through the mold dielectric layer 130 and the etch stop layer 127. The post etching process may be performed for increasing the upper width of the mold opening 150 and/or dry-cleaning for the mold opening 150. The post etching process may be a radio frequency (RF) etching process. In example embodiments, the RF etching process may be performed by an inductive coupled plasma (ICP) method or an electron cyclotron resonance (ECR) method. After the post etching process (S76), a cleaning process may be performed (S78). The cleaning process may be a wet cleaning process.

While the mold openings 150 are formed, the first contact plugs 140 may be protected by the capping patterns 145. Therefore, reliable variable resistors will be formed in the mold openings 150.

Figure 3F:
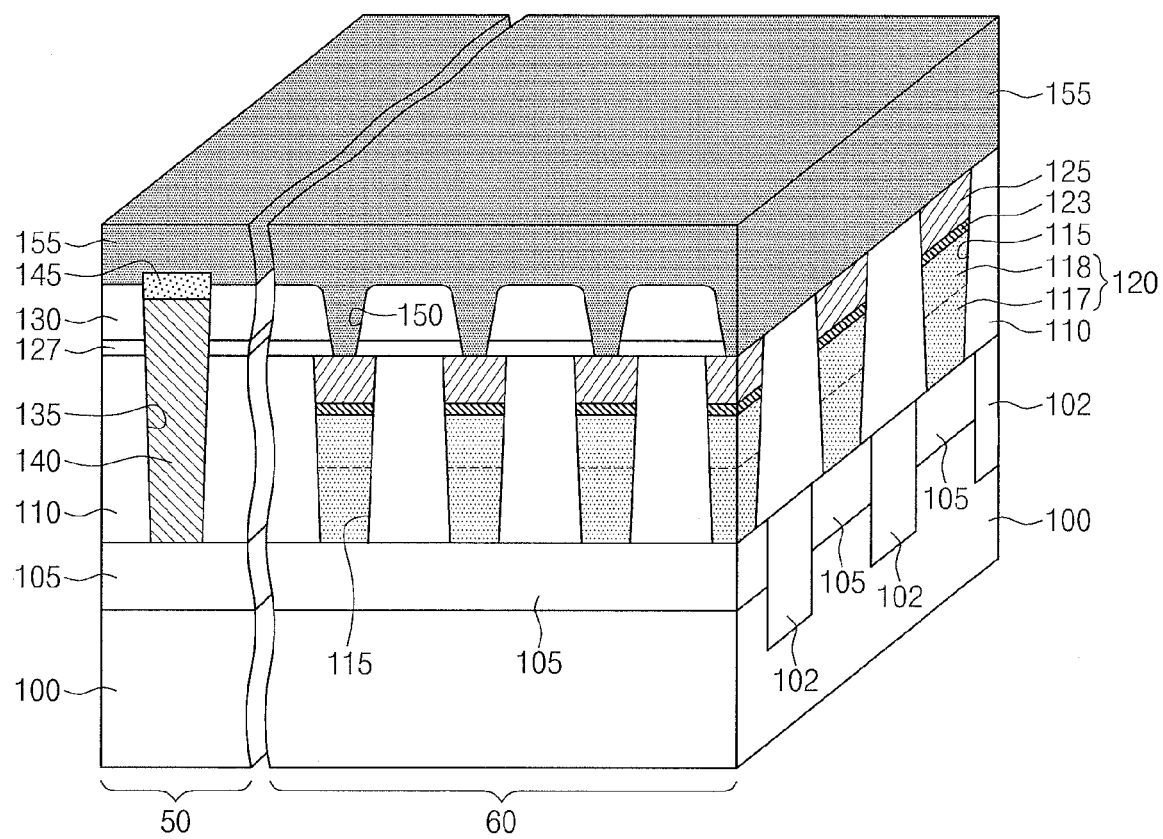
Figure 3F:
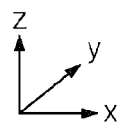

Referring to FIG. 3F, a variable resistance material layer 155 may be formed over the entire surface of the substrate 100 including the capping patterns 145 and the mold openings 150. The variable resistance material layer 155 may fill the mold openings 150. As described above, since the upper width of the mold opening 150 is wider than the lower width of the mold opening 150, the variable resistance material layer 155 may be more easily filled in the mold openings 150. In example embodiments, the variable resistance material layer 155 may be formed of a phase change material.

The phase change material of the variable resistance material layer 155 may include a compound including at least one of tellurium (Te) or selenium (Se) (chalcogenide elements), and at least one of germanium (Ge), antimony (Sb), bismuth (Bi), lead (Pb), tin (Sn), silver (Ag), arsenic (As), sulfur (S), silicon (Si), phosphorus (P), oxygen (O), or nitrogen (N). For example, the variable resistance material layer 155 may include at least one of Ge—Sb—Te, As—Sb—Te, As—Ge—Sb—Te, Sn—Sb—Te, Ag—In—Sb—Te, In—Sb—Te, Group 5A element-Sb—Te, Group 6A element-Sb—Te, Group 5A element-Sb—Se, or Group 6A element-Sb—Se.

Figure 3G:
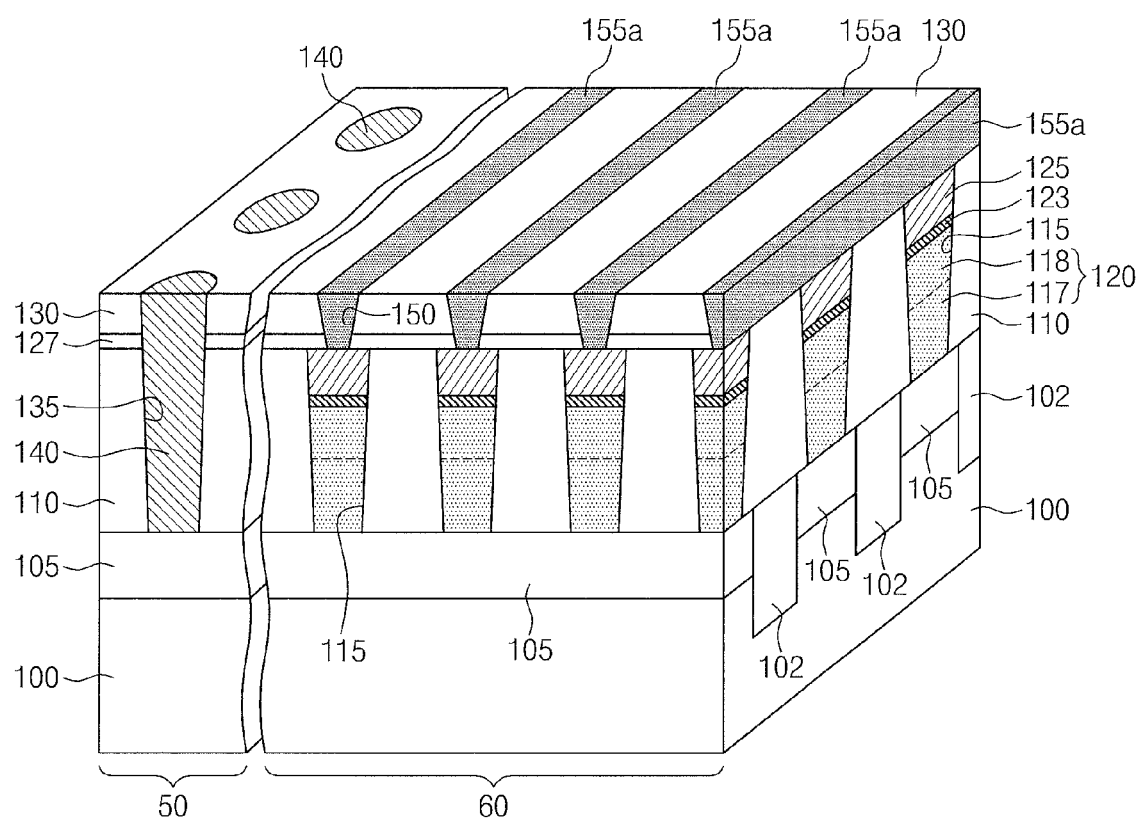

Referring to FIG. 3G, the variable resistance material layer 155 and the capping patterns 145 are planarized until the mold dielectric layer 130 is exposed, so as to form variable resistors 155a in the mold openings 150, respectively. The variable resistors 155a formed in the mold openings 150 may be separated from each other by the planarization process. The variable resistors 155a may have a line shape extending in the second direction. In example embodiments, the variable resistance material layer 155 and the capping patterns 145 may be planarized until the mold dielectric layer 130 and the first contact plugs 140 are exposed. Then, as shown in FIG. 3G, the capping patterns 145 may be entirely removed, and the first contact plugs 140 may be exposed. In example embodiments, the upper surfaces of the mold dielectric layer 130, the first contact plugs 140, and the variable resistors 155a may be disposed substantially at the same level. In example embodiments, the planarization process of the variable resistance material layer 155 and the capping patterns 145 may be performed by a chemical mechanical polishing method.

Figure 3H:
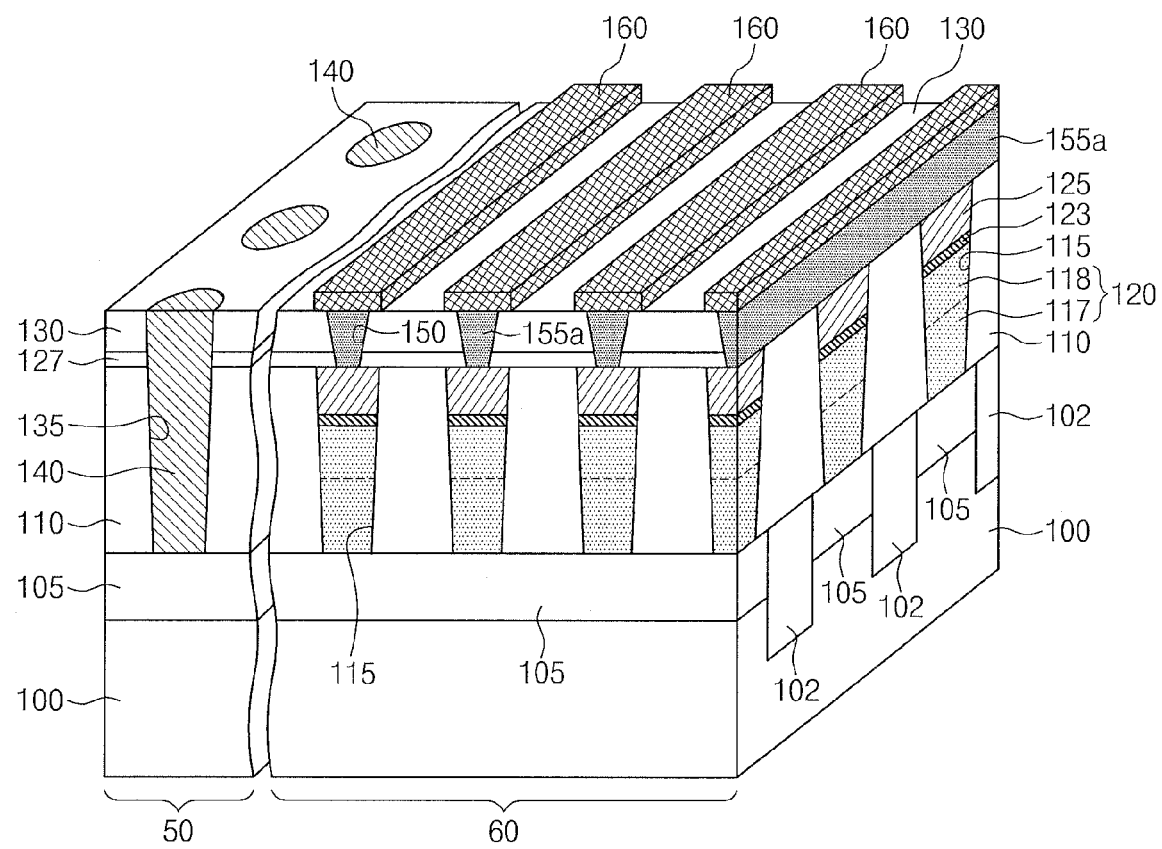

Referring to FIG. 3H, an upper electrode layer may be formed over the entire surface of the substrate 100, and the upper electrode layer may be patterned so as to form upper electrodes 160 on the variable resistors 155a, respectively. The upper electrodes 160 may extend in parallel with the variable resistors 155a. The upper electrodes 160 may make contact with the upper surfaces of the variable resistors 155a, respectively. In example embodiments, as shown in FIG. 3H, after the upper electrodes 160 are formed, the upper electrode layer may be entirely removed from the first region 50. However, the inventive concepts are not limited thereto. In example embodiments, when the upper electrodes 160 are formed, landing parts (not shown) may be formed of portions of the upper electrode layer in the first region 50. The landing parts may be disposed on the first contact plugs 140, respectively.

Figure 3I:
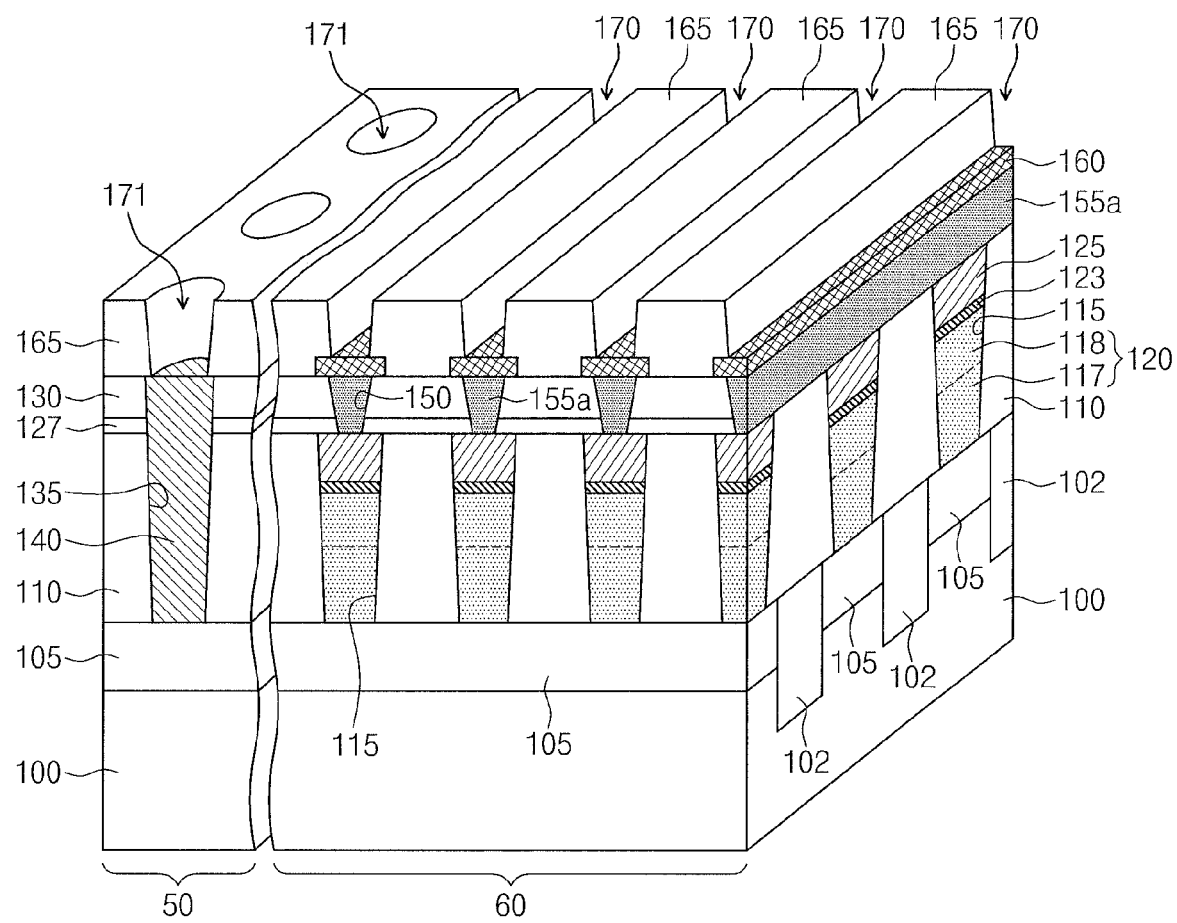

Referring to FIG. 3I, a first upper interlayer dielectric layer 165 may be formed over the entire surface of the substrate 100 including the upper electrodes 160. A portion of the first upper interlayer dielectric layer 165 disposed in the first region 50 may be patterned to form second contact holes 171. The first contact plugs 140 may be exposed by the second contact holes 171, respectively. The other portion of the first upper interlayer dielectric layer 165 disposed in the second region 60 may be patterned to form upper openings 170. The upper electrodes 160 may be exposed by the upper opening 170, respectively. The upper openings 170 may have a groove shape extending in the second direction. The second contact holes 171 and the upper openings 170 may be simultaneously formed.

Figure 3J:
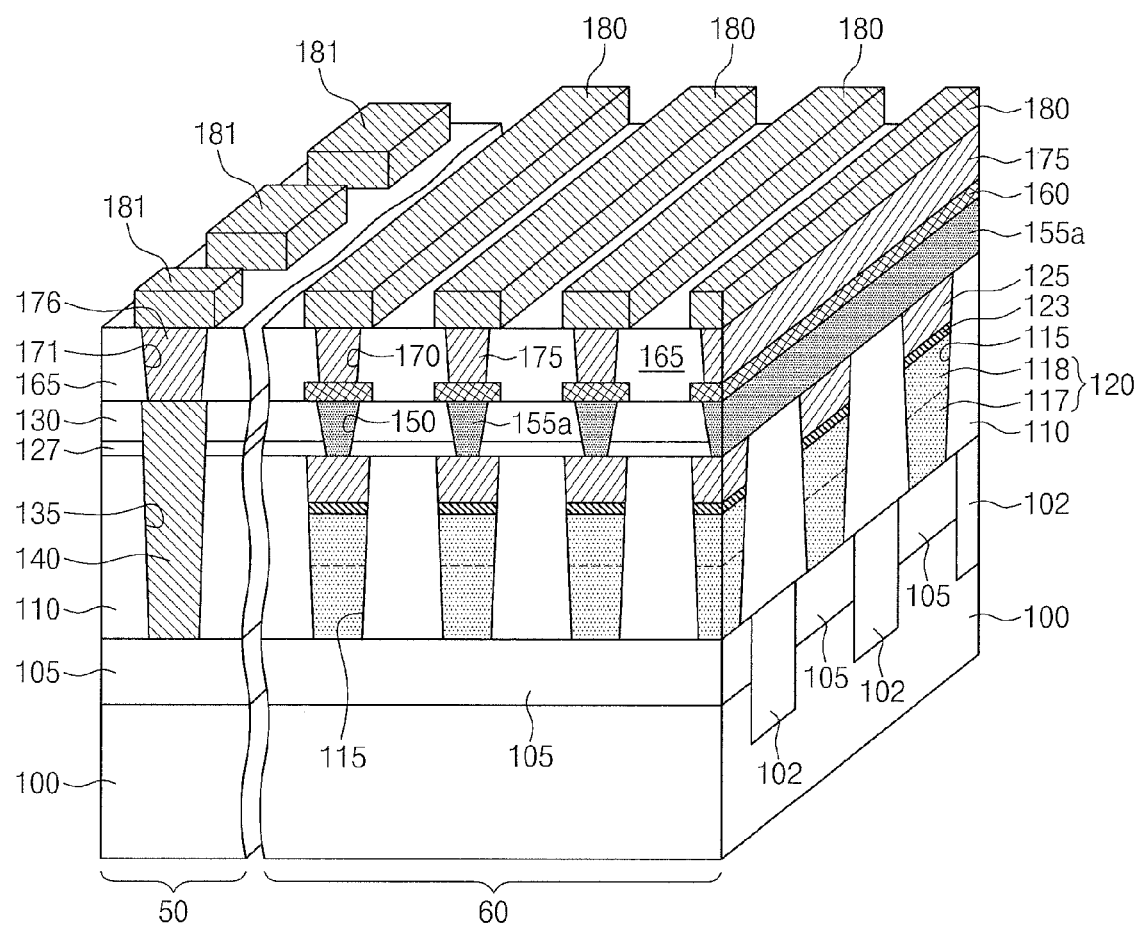

Referring to FIG. 3J, a second conductive layer formed over the entire surface of the substrate 100 to fill the second contact holes 171 and the upper openings 170. The second conductive layer may be planarized until the first upper interlayer dielectric layer 165 is exposed so as to form second contact plugs 176 in the first region 50 and buried electrodes 175 in the second region 60. The second contact plugs 176 may fill the second contact holes 171, respectively. The buried electrodes 175 may fill the upper openings 170, respectively. Since the second contact plugs 176 and the buried electrodes 175 are respectively formed by portions of the second conductive layer, the second contact plugs 176 and the buried electrodes 175 may include the same conductive material.

The second conductive layer may include a metal layer (e.g., a tungsten layer, a copper layer, or an aluminum layer). In addition, the conductive layer may further include a barrier layer (e.g., a conductive metal layer, for example, a titanium nitride layer and/or a tantalum nitride layer) under the second metal layer, and/or a glue layer (e.g., a titanium layer and/or a tantalum layer). The planarization process of the second conductive layer may be performed by a chemical mechanical polishing method or an etch-back method.

A bit line conductive layer may be formed on the first upper interlayer dielectric layer 165, and the bit line conductive layer may be patterned so as to form bit lines 180 connected to the buried electrodes 175 in the second region 60. In example embodiments, when the bit lines 180 are formed, landing pads 181 may be formed in the first region 50. The landing pads 181 may be formed on the second contact plugs 176, respectively. The landing pads 181 may be formed of portions of the bit line conductive layer in the first region 50.

As shown in FIG. 1, a second upper interlayer dielectric layer 185 may be formed, and third contact plugs 188 may be formed through the second upper interlayer dielectric layer 185 in the first region 50. The third contact plugs 188 may be connected to the landing pads 181, respectively. As shown in FIG. 1, strapping lines 190 may be formed on the second upper interlayer dielectric layer 185. In this way, the semiconductor memory device shown in FIG. 1 can be provided.

In the method of fabricating a semiconductor memory device, when the mold openings 150 are formed, the first contact plugs 140 may be protected by the capping patterns 145. Therefore, more reliable variable resistors 155a can be formed in the mold openings 150.

If the capping patterns 145 are not formed, metal atoms from the first contact plugs 140 may move into the mold openings 150 while the mold openings 150 are formed. For example, while the post etching process and/or the cleaning process are performed, metal atoms from the first contact plugs 140 may move into the mold openings 150. That is, the variable resistors 155a may include metal atoms of the first contact plugs 140. In example embodiments, the variable resistors 155a may not be reliably operated. However, according to the above-described example embodiments of the inventive concepts, while the mold openings 150 are formed, the capping patterns 145 protect the first contact plugs 140 to prevent or reduce metal atoms of the first contact plugs 140 from moving out of the first contact holes 135. Therefore, the semiconductor memory device including the variable resistors 155a can be more reliable. In addition, since the distance between the first contact plugs 140 and the variable resistors 155a can be reduced, the semiconductor memory device can be highly optimized or improved, and integrated.

Methods of fabricating the semiconductor memory devices shown in FIGS. 2A through 2E will be explained. Characteristic features of the methods will be mainly explained.

A method of fabricating the semiconductor memory device shown in FIG. 2A may be similar to the method explained with reference to FIGS. 3A through 3J. However, referring to FIG. 3I, the semiconductor memory device shown in FIG. 2A may be fabricated by forming the second contact hole 171 to partially expose the upper surface of the first contact plug 140 and further etching a portion of the upper surface of the first contact plugs 140 exposed by the second contact holes 171. The portion of the upper surface of the first contact plug 140 exposed by the second contact hole 171 may be etched by an additional etching process and/or an over-etching process.

A method of fabricating the semiconductor memory device shown in FIG. 2B may be similar to the method explained with reference to FIGS. 3A through 3J. However, the semiconductor memory device shown in FIG. 2B may be fabricated by forming the second contact hole 171' to expose the entire upper surface of the first contact plug 140 and etching the entire exposed upper surface of the first contact plug 140. The entire upper surface of the first contact plug 140 exposed by the second contact hole 171' may be etched through an additional etching process and/or an over-etching process.

Figure 5A:
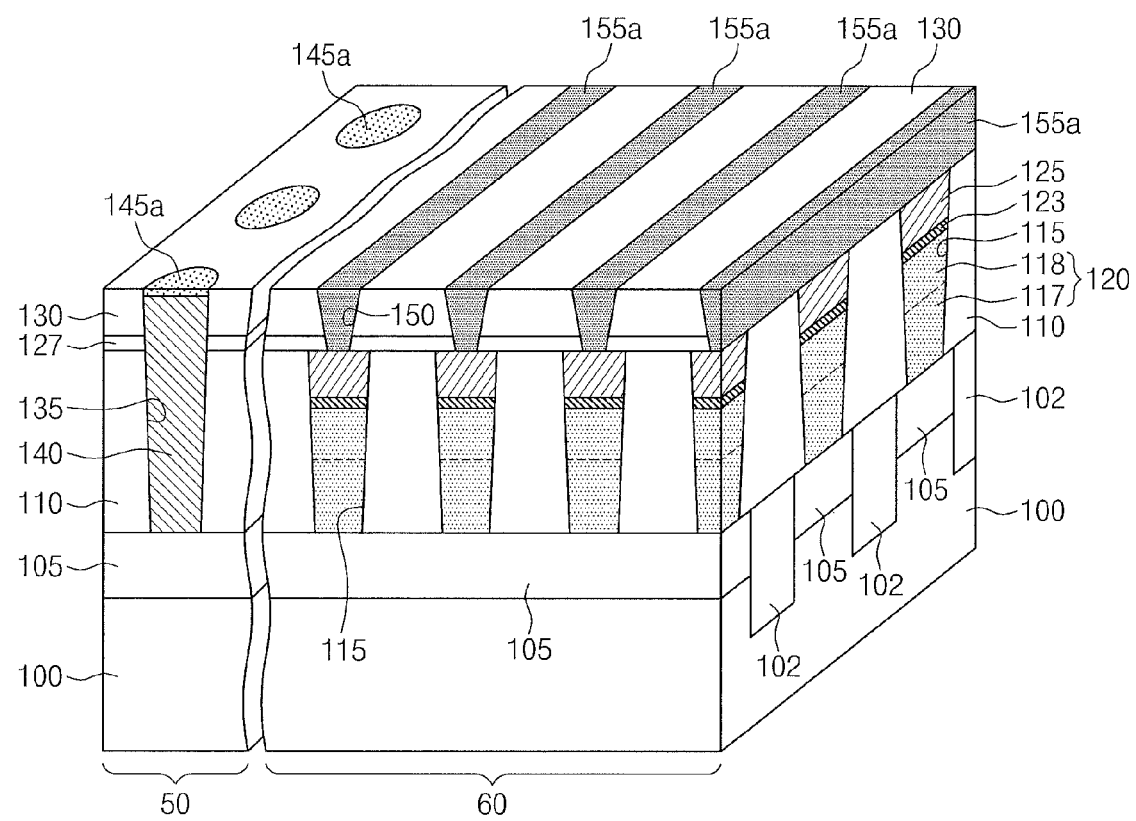
FIGS. 5A through 5C are perspective views for explaining a modification example of the method of fabricating a semiconductor memory device according to example embodiments of the inventive concepts.
Figure 5B:
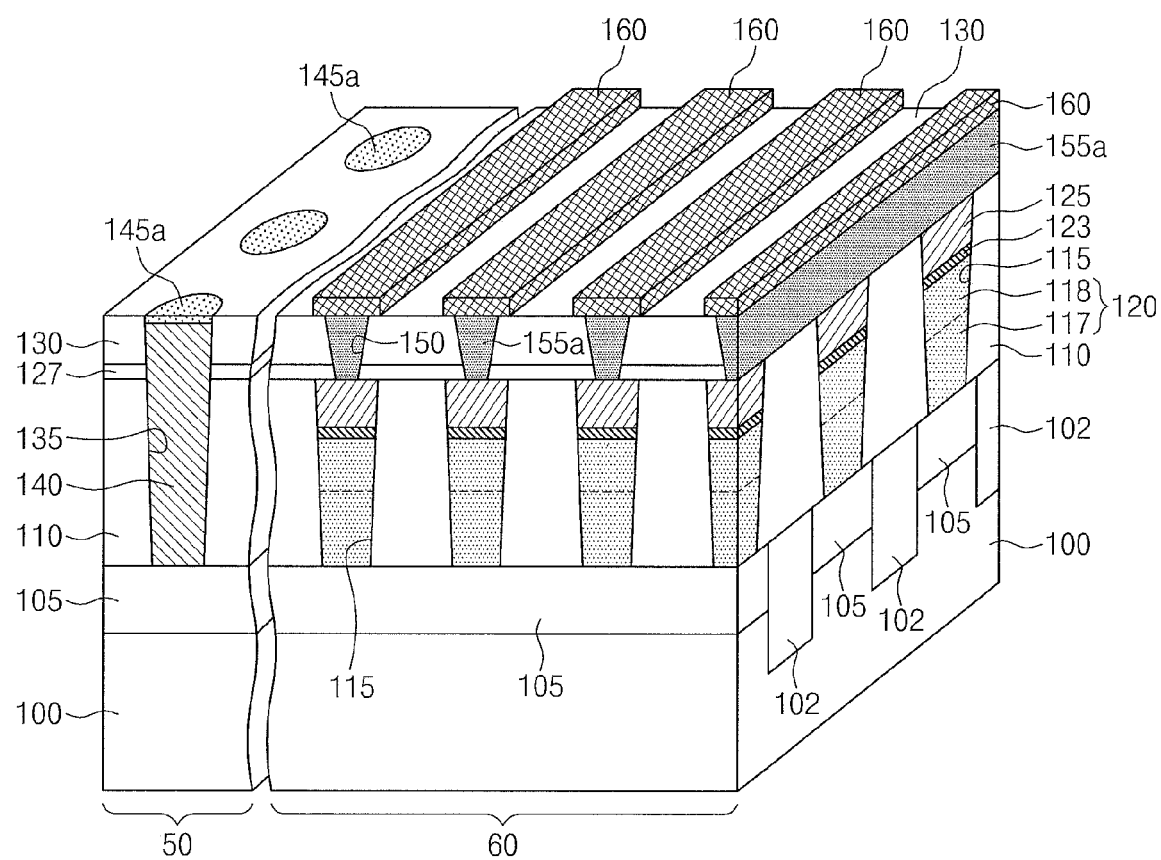
Figure 5C:
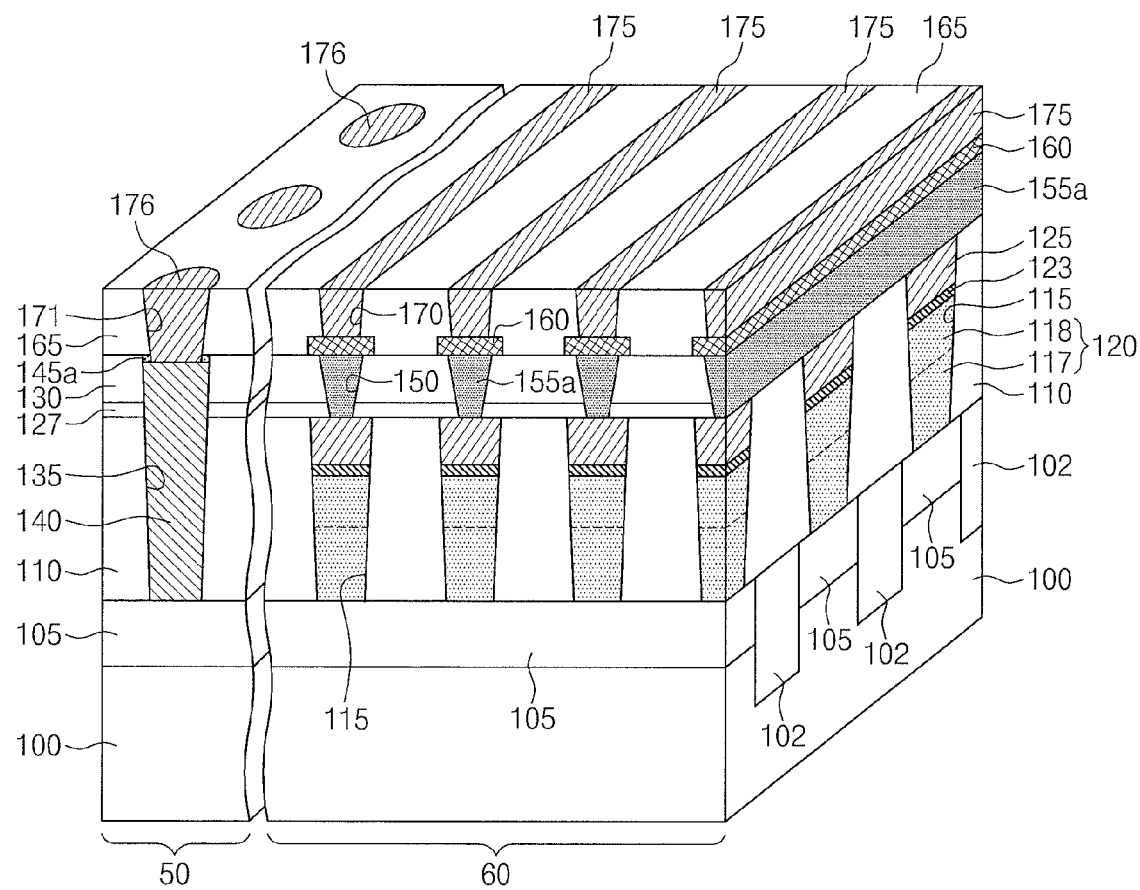
Figure 5C:
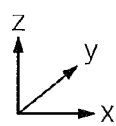

A method of fabricating the semiconductor memory device shown in FIG. 2C will now be explained with reference to FIGS. 5A through 5C. The method of fabricating the semiconductor memory device shown in FIG. 2C may include the methods explained with reference to FIGS. 3A through 3F and FIG. 4. FIGS. 5A through 5C are perspective views for explaining a modification example of the method of fabricating a semiconductor memory device according to example embodiments of the inventive concepts.

Referring to FIG. 3F and FIG. 5A, the variable resistance material layer 155 and the capping patterns 145 may be planarized until the mold dielectric layer 130 is exposed, so as to form variable resistors 155a. At this time, planarized capping patterns 145a may remain on the first contact plugs 140, respectively. The planarized capping patterns 145a may cover the entire upper surfaces of the first contact plugs 140. Upper surfaces of the planarized capping patterns 145a may be disposed substantially at the same level as the upper surface of a mold dielectric layer 130. In example embodiments, the upper surfaces of the planarized capping patterns 145a may be disposed substantially at the same level as the upper surfaces of the variable resistors 155a.

Referring to FIG. 5B, an upper electrode layer may be formed above the substrate 100, and the upper electrode layer may be patterned so as to form upper electrodes 160. At this time, the upper electrode layer may be completely removed from the first region 50. Thus, after the upper electrodes 160 are formed, the planarized capping patterns 145a may be exposed.

Referring to FIG. 5C, a first upper interlayer dielectric layer 165 may be formed over the entire surface of the substrate 100. Second contact holes 171 may be formed in the first region 50. The second contact holes 171 may be formed sequentially through the first upper interlayer dielectric layer 165 and the planarized capping patterns 145a so as to expose the upper surfaces of the first contact plugs 140, respectively. At this time, a portion of the upper surface of the first contact plug 140 may be exposed through the second contact holes 171, and the other portion of the upper surface of the first contact plug 140 may not be exposed. A portion of the planarized capping pattern 145a may remain on the other portion of the upper surface of the first contact plug 140.

In example embodiments, the portion of the upper surface of the first contact plug 140 exposed through the second contact hole 171 may be etched so that an exposed portion of the upper surface of the first contact plug 140 may become lower than the other portion of the upper surface of the first contact plug 140 disposed under the remaining planarized capping pattern 145a. Upper openings 170 may be formed through the first upper interlayer dielectric layer 165 in the second region 60.

The second contact holes 171 and the upper openings 170 may be simultaneously formed. A second conductive layer may be formed to fill the second contact holes 171 and the upper openings 170, and the second conductive layer may be planarized until the first upper interlayer dielectric layer 165 is exposed, so as to form second contact plugs 176 in the second contact holes 171 and buried electrodes 175 in the upper openings 170. The following processes may be performed in the same ways as explained with reference to FIG. 3J and FIG. 1. In this way, the semiconductor memory device shown in FIG. 2C can be fabricated.

A method of fabricating the semiconductor memory device shown in FIG. 2D will be explained with reference to FIG. 6. The method of fabricating the semiconductor memory device shown in FIG. 2D may include the method explained with reference to FIGS. 3A through 3F.

Figure 6:
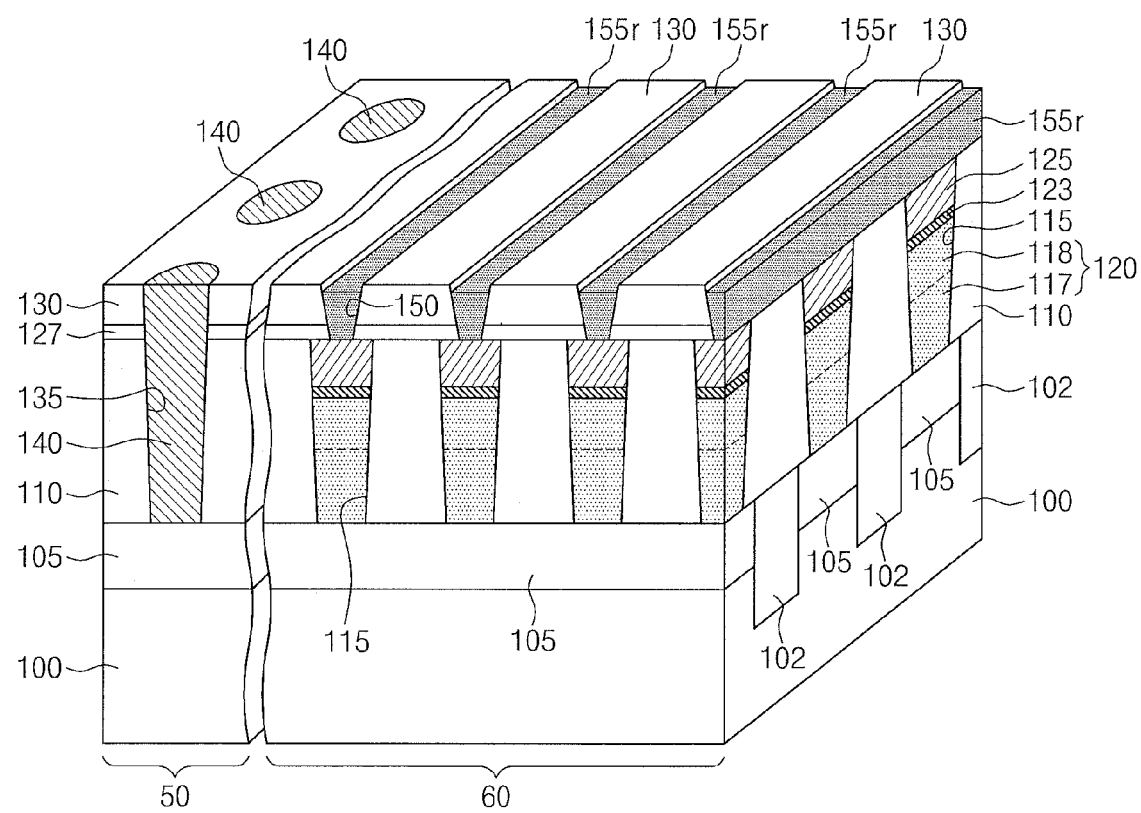
FIG. 6 is a perspective view for explaining another modification example of the method of fabricating a semiconductor memory device according to example embodiments of the inventive concepts.

FIG. 6 is a perspective view for explaining another modification example of the method of fabricating a semiconductor memory device according to example embodiments of the inventive concepts.

Referring to FIG. 3F and FIG. 6, the variable resistance material layer 155 and the capping patterns 145 may be planarized until the mold dielectric layer 130 is exposed, so as to form variable resistors 155r. The upper surfaces of the variable resistors 155r may be recessed to a level lower than the upper surface of the mold dielectric layer 130. If the etch rate of the variable resistance material layer 155 is much higher than the etch rate of the mold dielectric layer 130, the upper surfaces of the variable resistors 155r may be recessed to a level lower than the upper surface of the mold dielectric layer 130 by the planarization process. Otherwise, an additional recess process may be performed after the variable resistance material layer 155 is planarized. As shown in FIG. 6, all the capping patterns 145 may be removed by the planarization process.

Alternatively, the method explained with reference to FIGS. 5A through 5C may be applied to example embodiments. In example embodiments, portions of the capping patterns 145 may remain after the planarization process. The next processes may be performed in the same ways as explained with reference to FIGS. 3H, 3J, and 1.

A method of fabricating the semiconductor memory device shown in FIG. 2E will be explained with reference to FIG. 7. The method of fabricating the semiconductor memory device shown in FIG. 2E may include the method explained with reference to FIGS. 3A through 3D.

Figure 7:
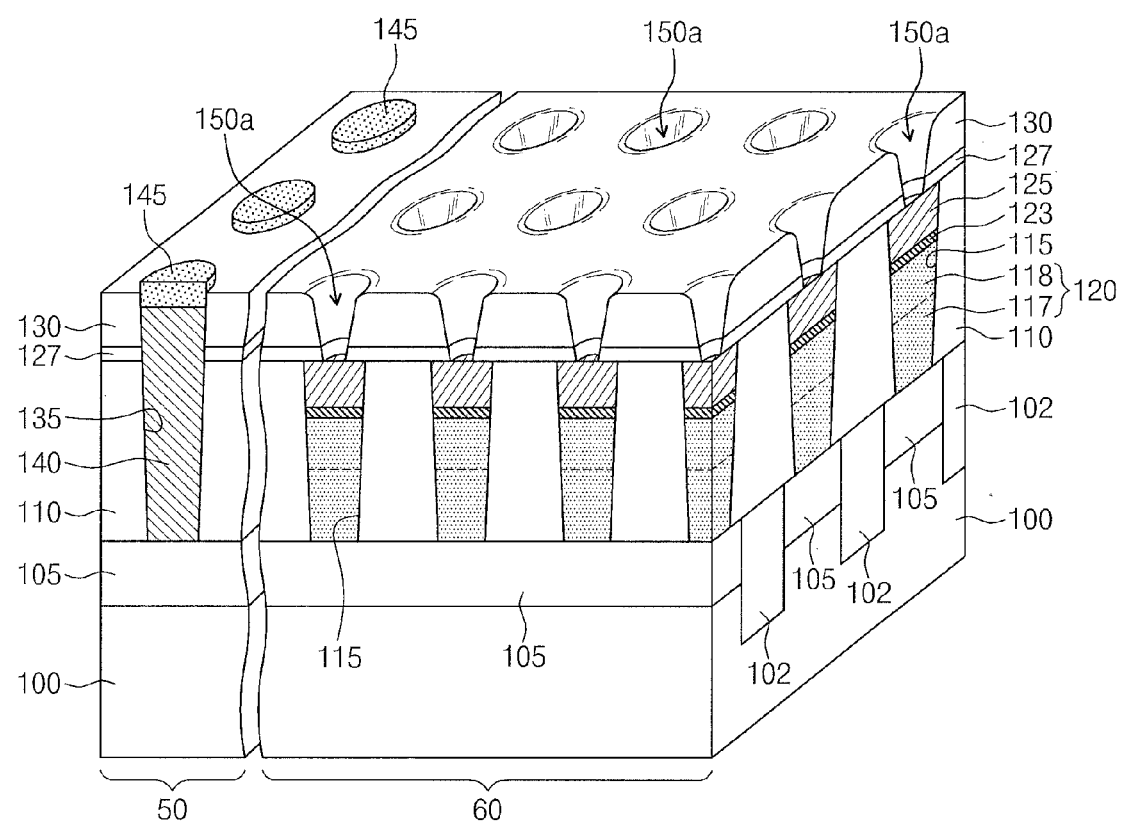
FIG. 7 is a perspective view for explaining another modification example of the method of fabricating a semiconductor memory device according to example embodiments of the inventive concepts.
Figure 7:
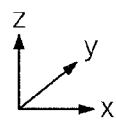

FIG. 7 is a perspective view for explaining another modification example of the method of fabricating a semiconductor memory device according to example embodiments of the inventive concepts.

Referring to FIGS. 3D and 7, mold openings 150a may be formed sequentially through the mold dielectric layer 130 and the etch stop layer 127 in the second region 60 of the substrate 100 including the capping patterns 145. Each of the lower electrodes 125 may be exposed through each of the mold openings 150a. That is, the mold openings 150 may be two-dimensionally arranged in the first and second directions to form a plurality of rows and a plurality of columns. The mold openings 150a may be spaced apart from each other in the first and second directions.

As explained with reference to FIGS. 3F and 3G, a variable resistance material layer 155 may be formed above the substrate 100 to fill the mold openings 150a, and the variable resistance material layer 155 and the capping patterns 145 may be planarized until the mold dielectric layer 130 is exposed, so as to form variable resistors 155b as shown in FIG. 2E.

Referring to FIG. 2E, upper electrodes 160a may be formed on the mold dielectric layer 130 at positions corresponding to the variable resistors 155b, and a first upper interlayer dielectric layer 165 may be formed. The first upper interlayer dielectric layer 165 may be patterned so as to form hole-shaped upper openings 170a in the second region 60 to expose the upper electrodes 160a and form second contact holes 171 in the first region 50. The upper openings 170a may correspond to the variable resistors 155b, respectively. Second contact plugs 176 and buried electrodes 175a may be formed to fill the second contact holes 171 and the upper openings 170a. The buried electrodes 175a may be electrically connected to the variable resistors 155b. For this, the buried electrodes 175a may be arranged in rows and columns.

Landing pads 181 may be formed in the first region 50, and bit lines 180 may be formed in the second region 60. The bit lines 180 may be connected to the buried electrodes 175a in a manner such that one bit line 180 is connected to a line of the buried electrodes 175a. As explained with reference to FIGS. 3J and 1, a second upper interlayer dielectric layer 185, third contact plugs 188, and strapping lines 190 may be formed. In this way, the semiconductor memory device shown in FIG. 2E can be fabricated.

In example embodiments, the same elements as those of other example embodiments will be denoted by the same reference numerals. Descriptions of the same elements may not be given for conciseness.

Figure 8:
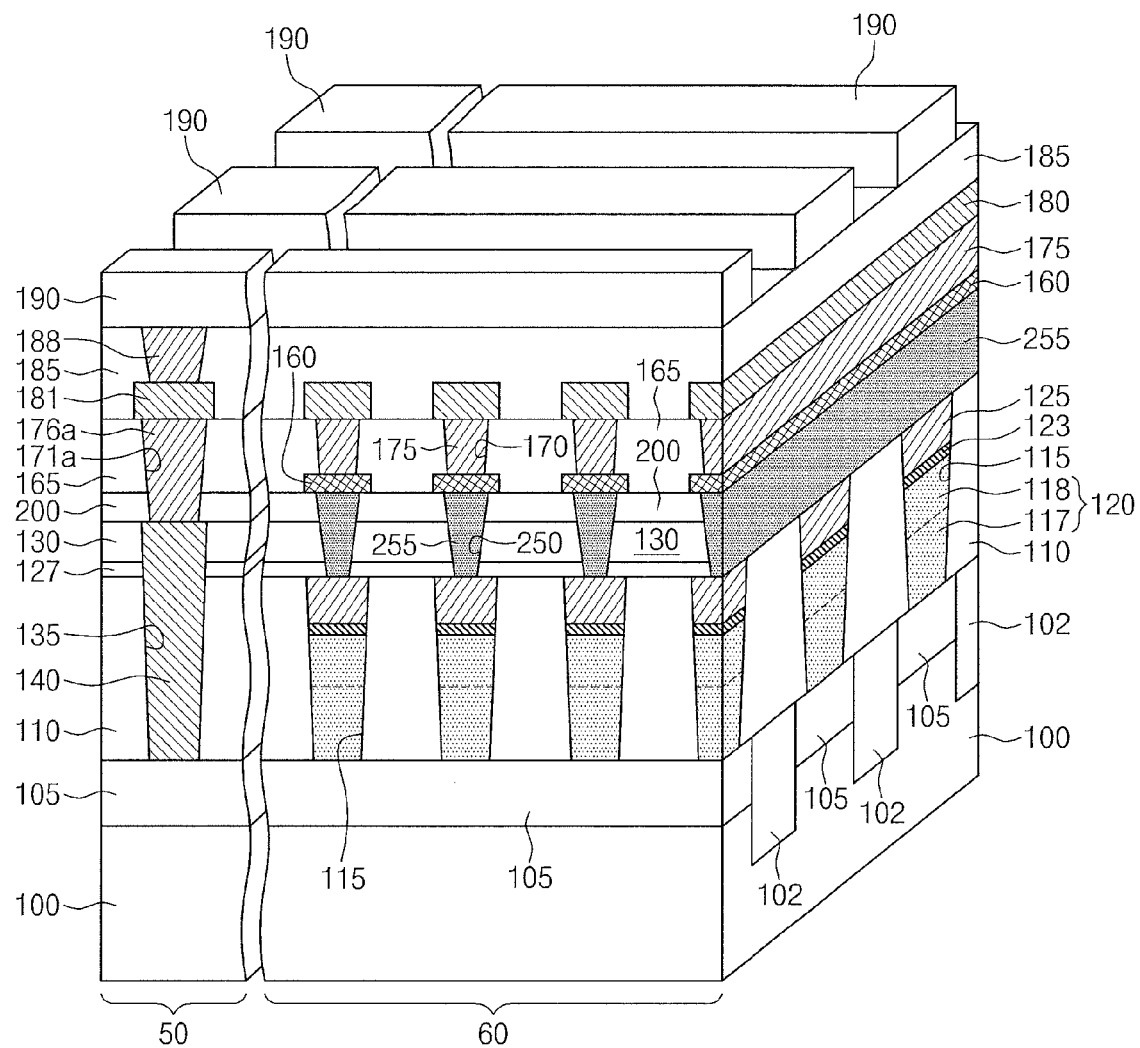
FIG. 8 is a perspective view illustrating a semiconductor memory device according to example embodiments of the inventive concepts.

FIG. 8 is a perspective view illustrating a semiconductor memory device according to example embodiments of the inventive concepts. Referring to FIG. 8, an etch stop layer 127 and a first mold dielectric layer 130 may be sequentially stacked on a lower interlayer dielectric layer 110. First contact plugs 140 may be respectively disposed in first contact holes 135 which are formed sequentially through the first mold dielectric layer 130, the etch stop layer 127, and the lower interlayer dielectric layer 110 in a first region 50. A second mold dielectric layer 200 may be disposed over the entire surface of a substrate 100 including the first mold dielectric layer 130. Variable resistors 255 may be disposed in mold openings 250 which are formed sequentially through the second mold dielectric layer 200, the first mold dielectric layer 130, and the etch stop layer 127 in a second region 60. In example embodiments, the upper surfaces of the variable resistors 255 may be disposed at a level higher than the upper surfaces of the first contact plugs 140.

The upper surfaces of the first contact plugs 140 may be disposed at a level substantially equal to or lower than the level of the upper surface of the first mold dielectric layer 130. The upper surfaces of the first contact plugs 140 may be disposed on a level higher than the bottom surface of the first mold dielectric layer 130. In example embodiments, as shown in FIG. 8, the upper surfaces of the first contact plugs 140 may be disposed substantially at the same level as the upper surface of the first mold dielectric layer 130. The upper surfaces of the variable resistors 255 may be disposed at a level substantially equal to or lower than the level of the upper surface of the second mold dielectric layer 200. The upper surfaces of the variable resistors 255 may be higher than the bottom surface of the second mold dielectric layer 200.

In example embodiments, as shown in FIG. 8, the upper surfaces of the variable resistors 255 may be disposed substantially at the same level as the upper surface of the second mold dielectric layer 200. The second mold dielectric layer 200 may have a single-layer or multilayer structure and may contain oxide, nitride, and/or oxynitride. In example embodiments, the second mold dielectric layer 200 may have a single-layer structure formed of oxide. The variable resistors 255 may include the same material as that included in the variable resistors 155a of FIG. 1. The variable resistors 255 and the mold openings 250 may extend in one direction. Each of the variable resistors 255 may make contact with lower electrodes 125 arranged in each of the columns.

The upper electrodes 160 may be disposed on the second mold dielectric layer 200 in the second region 60. The upper electrodes 160 may extend in parallel with the variable resistors 255. The upper electrodes 160 may make contact with the upper surfaces of the variable resistors 255, respectively.

A first upper interlayer dielectric layer 165 may be disposed on the second mold dielectric layer 200. Second contact plugs 176a may be disposed in second contact holes 171a which are formed sequentially through the first upper interlayer dielectric layer 165 and the second mold dielectric layer 200 in the first region 50. The second contact plugs 176a may make contact with at least portions of the upper surfaces of the first contact plugs 140, respectively. The buried electrodes 175 may be disposed in the first upper interlayer dielectric layer 165 in the second region 60. The buried electrodes 175 may fill upper openings 170 formed through the first upper interlayer dielectric layer 165 in the second region 60. The buried electrodes 175 may make contact with the upper electrodes 160, respectively. The second contact plugs 176a may be formed of the same material as that used to form the buried electrodes 175. The buried electrodes 175 include the same conductive material as that explained in other example embodiments, and thus a description thereof will not be repeated.

As shown in FIG. 8, bit lines 180 may be arranged side by side in the second region 60 on the first upper interlayer dielectric layer 165. The bit lines 180 may be connected to the buried electrodes 175, respectively. Landing pads 181 may be disposed on the first upper interlayer dielectric layer 165 in the first region 50. The landing pads 181 may make contact with the second contact plugs 176a, respectively.

A second upper interlayer dielectric layer 185 may be disposed over the entire surface of the substrate 100, and third contact plugs 188 may penetrate the second upper interlayer dielectric layer 185 in the first region 50 and connected to the landing pads 181, respectively. Strapping lines 190 may be disposed on the second upper interlayer dielectric layer 185 and connected to the third contact plugs 188, respectively. As described above, the strapping lines 190 may be electrically connected to doped lines 105, respectively, and may extend in parallel with the doped lines 105.

In the above-described semiconductor memory device, the second mold dielectric layer 200 may be disposed on the first contact plugs 140, and the mold openings 250 may be formed sequentially through the second mold dielectric layer 200, the first mold dielectric layer 130, and the etch stop layer 127 in the second region 60. Therefore, when the mold openings 250 are formed, the first contact plugs 140 can be protected by the second mold dielectric layer 200. As a result, the variable resistors 255 can be reliably operated, and thus the semiconductor memory device can be highly optimized and integrated.

Modification examples of the semiconductor memory device of other example embodiments will be described with reference to the accompanying drawings. For conciseness, characteristic features of the modification examples will be mainly described.

Figure 9A:
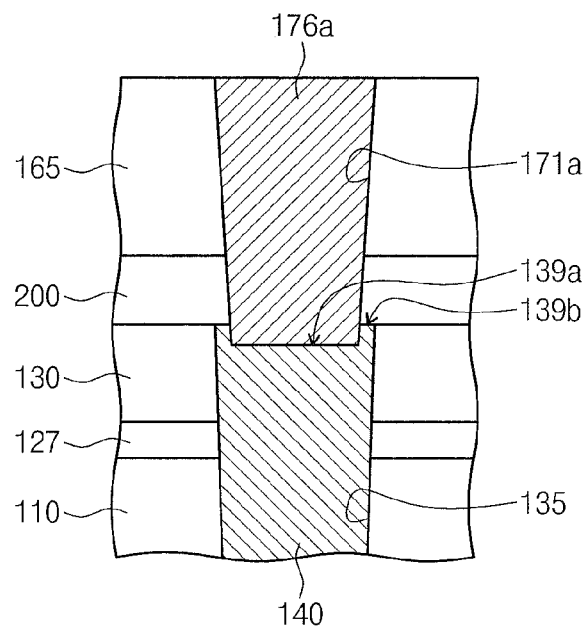
FIGS. 9A and 9B are enlarged views illustrating the first and second contact plugs of the semiconductor memory device of FIG. 8 so as to explain modification examples of the semiconductor memory device of example embodiments of the inventive concepts.

FIG. 9A is an enlarged view illustrating the first and second contact plugs 140 and 176a of the semiconductor memory device of FIG. 8 so as to explain a modification example of the semiconductor memory device of example embodiments of the inventive concepts.

Referring to FIG. 9A, the upper surface of the first contact plug 140 may include a first portion 139a making contact with the second contact plug 176a sequentially penetrating the first upper interlayer dielectric layer 165 and the second mold dielectric layer 200, and a second portion 139b not making contact with the second contact plug 176a. The first contact plug 140 may be disposed in a first contact hole 135, and the second contact plug 176a may be disposed in a second contact hole 171a, respectively. The first contact plug 140 may penetrate a mold dielectric layer 130, an etch stop layer 127, and a lower interlayer dielectric layer 110. According to example embodiments, the first portion 139a may be disposed at a level lower than the second portion 139b. The second portion 139b may be disposed substantially at the same level as the upper surface of the first mold dielectric layer 130. The first portion 139a lower than the second portion 139b may be disposed at a level higher than the bottom surface of the first mold dielectric layer 130.

Figure 9B:
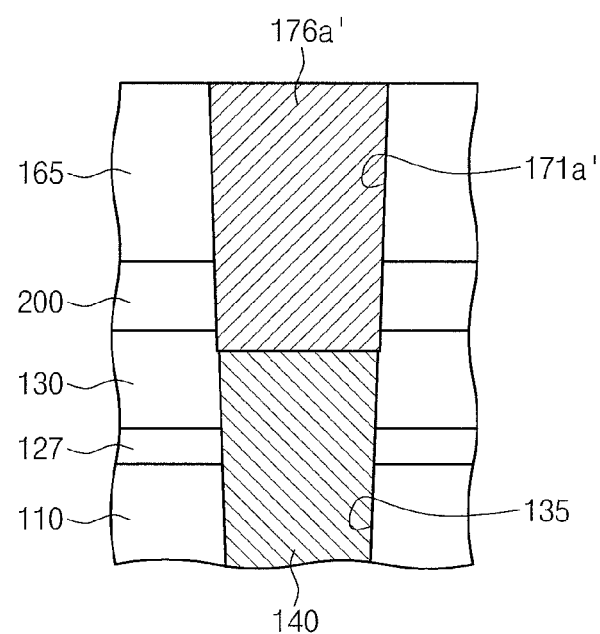

FIG. 9B is an enlarged view illustrating the first and second contact plugs 140 and 176a of the semiconductor memory device of FIG. 8 so as to explain another modification example of the semiconductor memory device of example embodiments of the inventive concepts.

Referring to FIG. 9B, a second contact plug 176a' may be disposed in a second contact hole 171a' which is formed sequentially through the first upper interlayer dielectric layer 165 and the second mold dielectric layer 200 in the first region 50. In example embodiments, the second contact plug 176a' may make contact with the entire upper surface of the first contact plug 140, and the entire upper surface of the first contact plug 140 may be disposed at a level lower than the upper surface of the first mold dielectric layer 130.

Figure 9C:
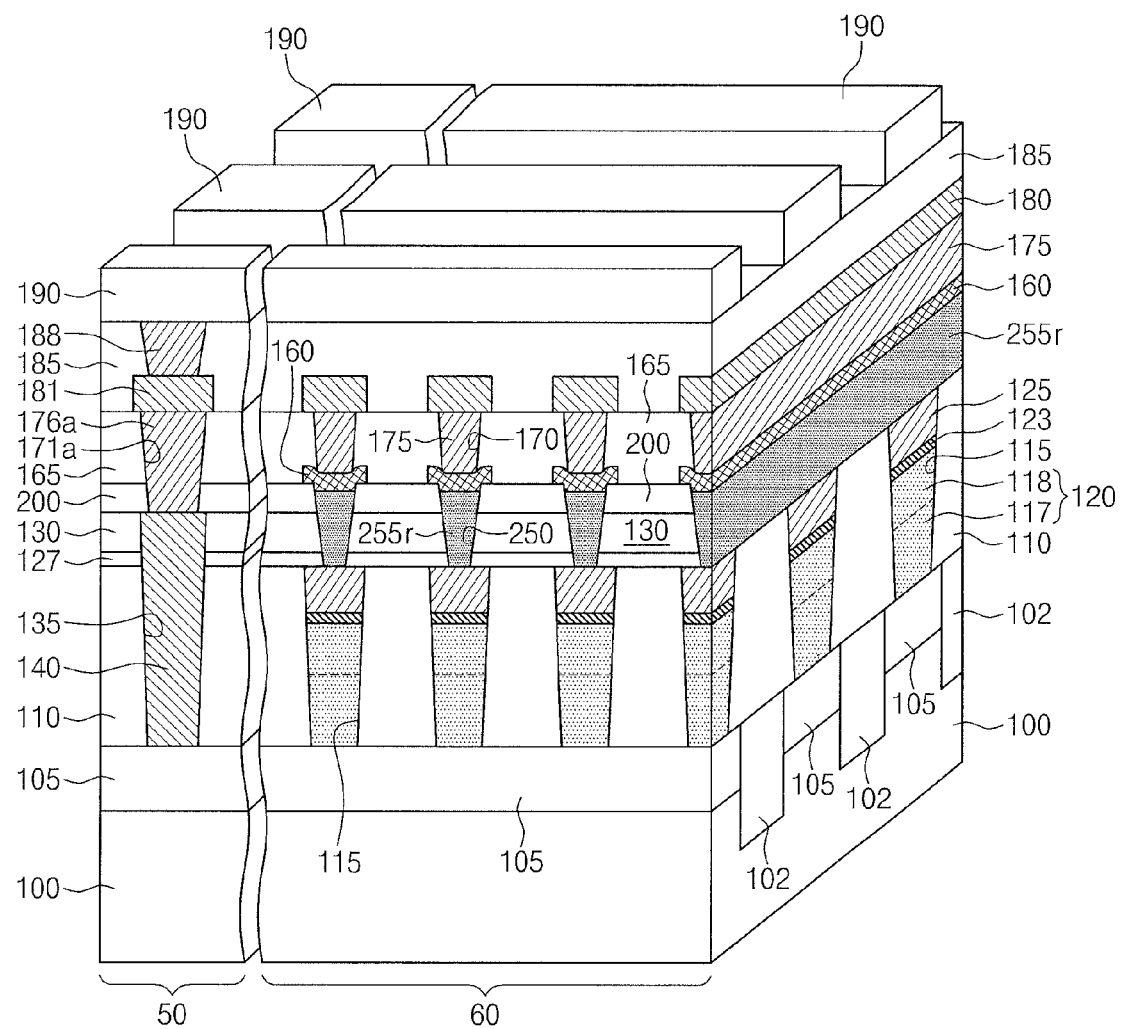
FIG. 9C is a perspective view illustrating another modification example of the semiconductor memory device of example embodiments of the inventive concepts.

FIG. 9C is a perspective view illustrating another modification example of the semiconductor memory device of example embodiments of the inventive concepts. Referring to FIG. 9C, variable resistors 255r may be disposed in mold openings 250. In example embodiments, the upper surfaces of the variable resistors 255r may be disposed at a level lower than the upper surface of a second mold dielectric layer 200. However, the upper surfaces of the variable resistors 255r may be higher than the bottom surface of the second mold dielectric layer 200. Upper electrodes 160 may extend downward to fill portions of the mold openings 250 higher than the upper surfaces of the variable resistors 255r, respectively. The variable resistors 255r may be formed of the same material as that used to form the variable resistors 155a of FIG. 1.

Figure 9D:
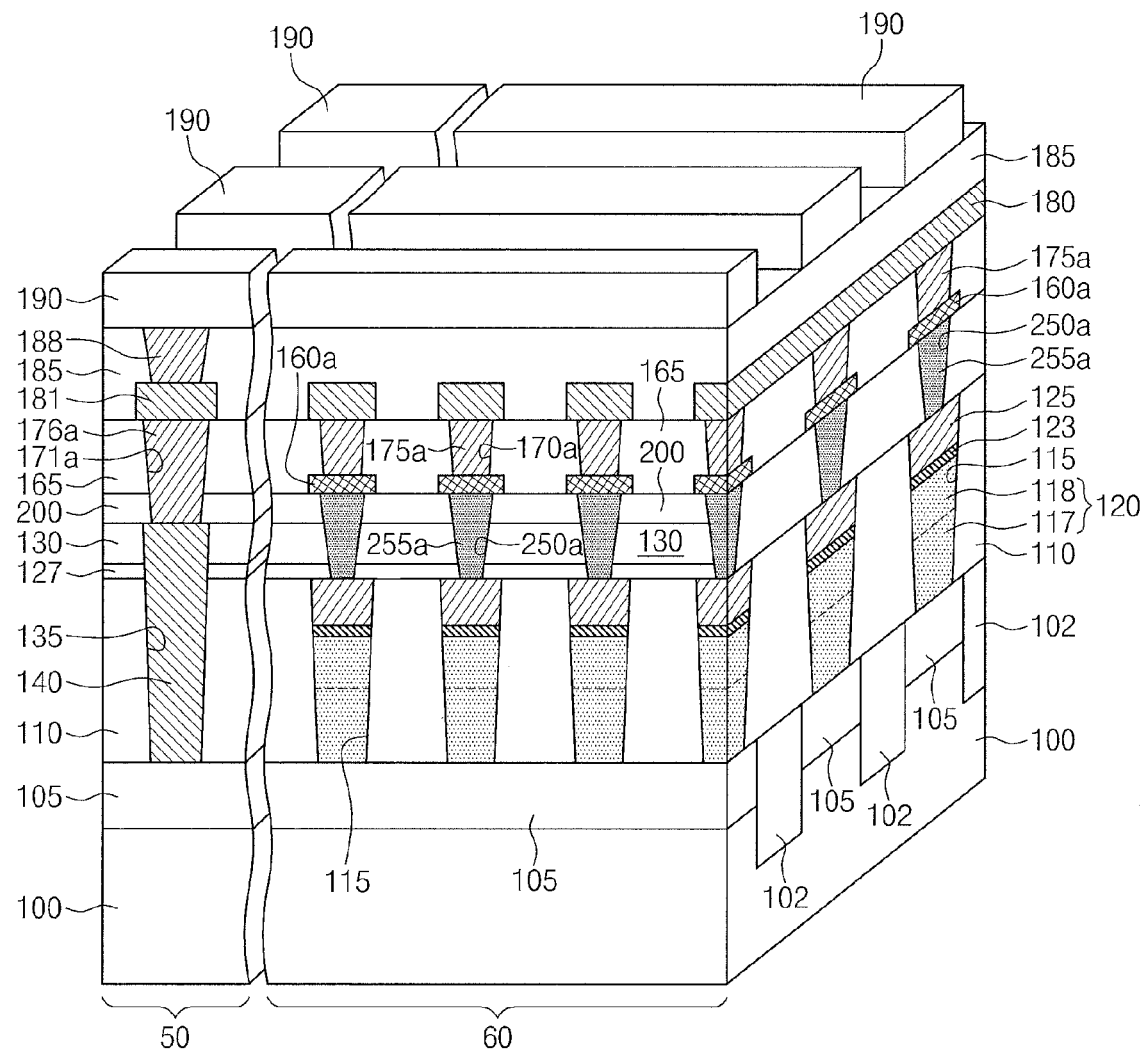
FIG. 9D is a perspective view illustrating another modification example of the semiconductor memory device of example embodiments of the inventive concepts.

FIG. 9D is a perspective view illustrating another modification example of the semiconductor memory device of example embodiments of the inventive concepts. The modification example shown in FIG. 9D may be similar to the modification example shown in FIG. 2E.

Referring to FIG. 9D, variable resistors 255a may be disposed respectively in mold openings 250a which are formed sequentially through a second mold dielectric layer 200, a first mold dielectric layer 130 and an etch stop layer 127 in a second region 60. Each of the mold openings 250a may expose single lower electrode 125. Therefore, according to the current modification example, a single variable resistor 255a may make contact with the single lower electrode 125.

Upper electrodes 160a may make contact with the upper surfaces of the variable resistors 255a, respectively. Each of the upper electrodes 160a may have a landing pad shape. Like the mold openings 250a, upper openings 170a formed through a first upper interlayer dielectric layer 165 in the second region 60 may have a hole shape, and the upper electrodes 160a may be exposed through the upper openings 170a, respectively. A buried electrode 175a disposed in each of the upper openings 170a may be electrically connected to each of the variable resistors 255a through each of the upper electrodes 160a. Each of bit lines 180 may be connected to the buried electrodes 175a arranged in each column. The variable resistors 255a may be formed of the same material as that used to form the variable resistors 155a of FIG. 1.

A method of fabricating a semiconductor memory device will be described according to example embodiments of the inventive concepts with reference to the accompanying drawings. The method may include the method explained with reference to FIGS. 3A through 3C. The first mold dielectric layer 130 explained with reference to FIG. 3C may correspond to a first mold dielectric layer 130 of example embodiments.

Figure 10A:
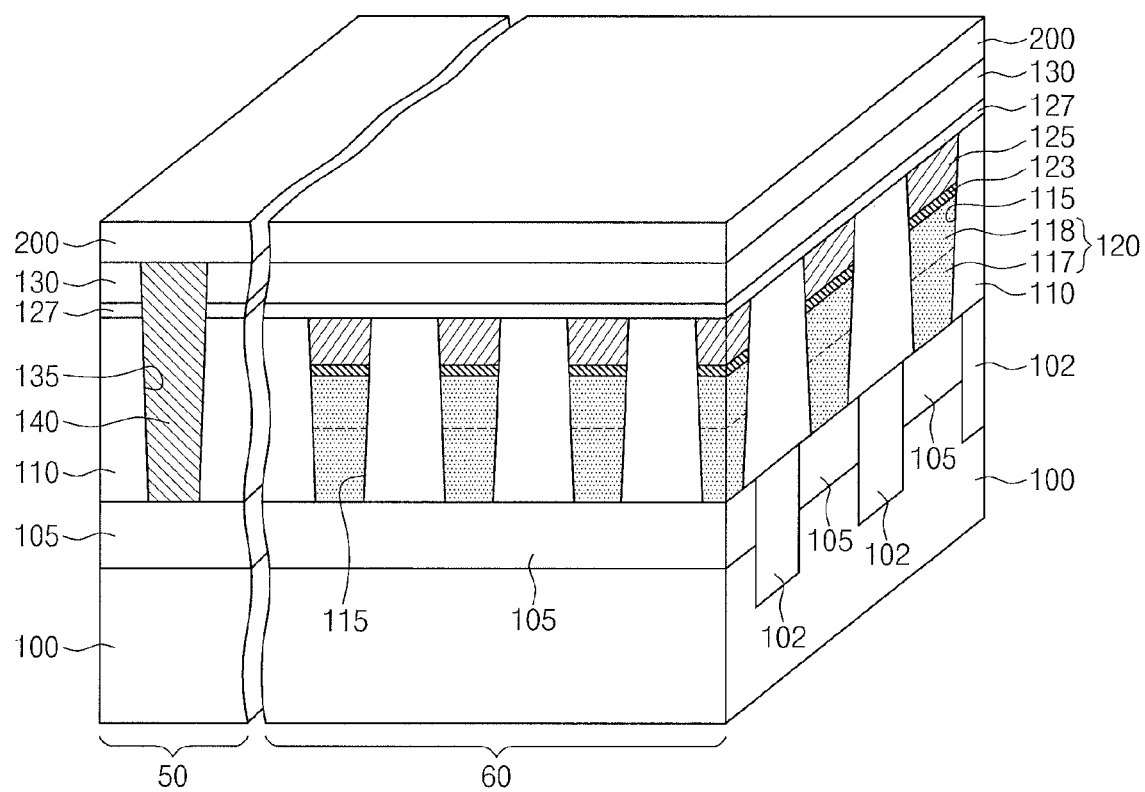
FIGS. 10A through 10D are perspective views for explaining a method of fabricating a semiconductor memory device according to example embodiments of the inventive concepts.

FIGS. 10A through 10D are perspective views for explaining a method of fabricating a semiconductor memory device according to example embodiments. Referring to FIGS. 3C and 10A, a second mold dielectric layer 200 may be formed over the entire upper surface of the substrate 100 including the first contact plugs 140 and the first mold dielectric layer 130. The second mold dielectric layer 200 may cover the upper surfaces of the first contact plugs 140. The second mold dielectric layer 200 may have a single-layer or multilayer structure and may contain oxide, nitride, and/or oxynitride. In example embodiments, the second mold dielectric layer 200 may have a single-layer structure formed of oxide.

Figure 10B:
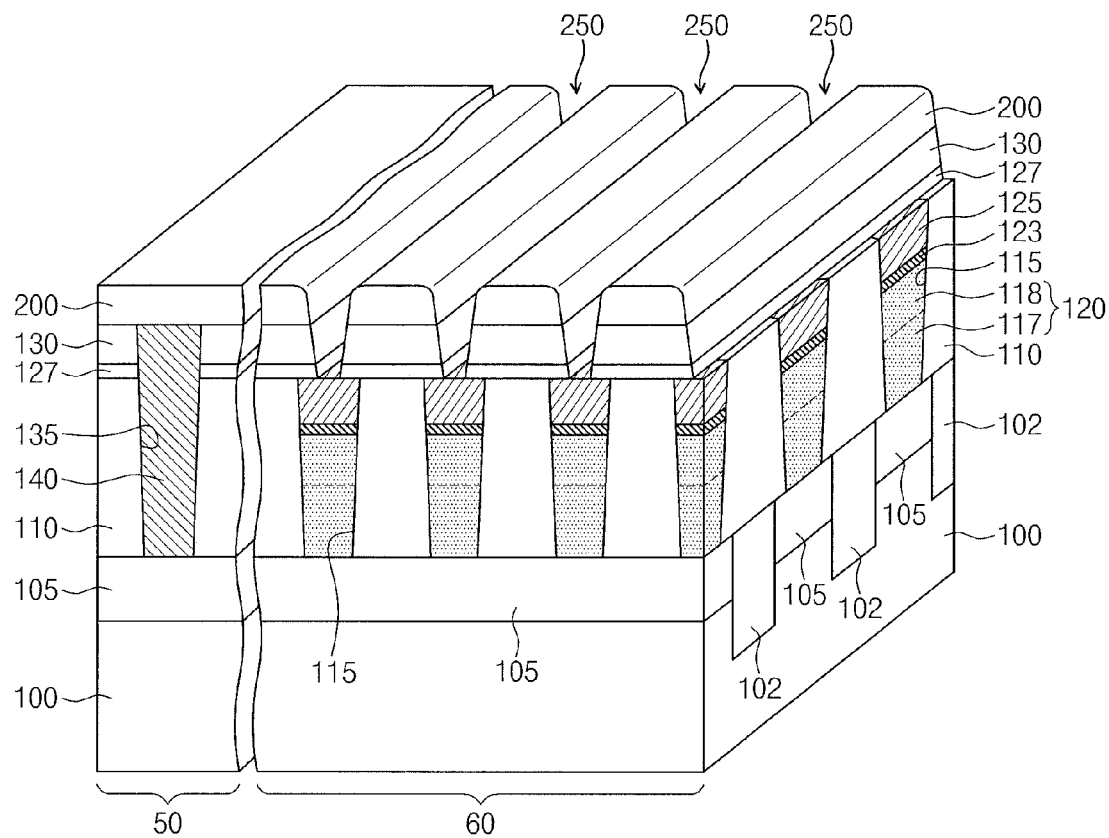

Referring to FIG. 10B, mold openings 250 may be formed sequentially through the second mold dielectric layer 200, the first mold dielectric layer 130, and the etch stop layer 127 in the second region 60. The mold openings 250 may expose the lower electrodes 125. In example embodiments, the mold openings 250 may be formed according to the processes explained with reference to the flowchart of FIG. 4. For example, a mask pattern defining the mold openings 250 may be formed on the second mold dielectric layer 200 (S70), and the mold openings 250 may be formed sequentially through the second mold dielectric layer 200 and the first mold dielectric layer 130 to expose the etch stop layer 127 by using the mask pattern as an etch mask (S72). The mask pattern may be removed (S74), and a post etching process may be performed on the mold openings 250 (S76). As described in example embodiments, the post etching process may be an RF etching process. The exposed etch stop layer 127 may be etched so that the mold openings 250 can be formed sequentially through the second mold dielectric layer 200, the first mold dielectric layer 130, and the etch stop layer 127.

As shown in FIG. 10B, the mold openings 250 may have a groove shape extending in one direction. In example embodiments, the lower electrodes 125 arranged in each column may be exposed by each of the mold openings 250.

Alternatively, the mold openings 250 may have a hole shape (refer to the mold openings 250a shown in FIG. 9D) so that the lower electrodes 125 are exposed through the mold openings 250, respectively.

Figure 10C:
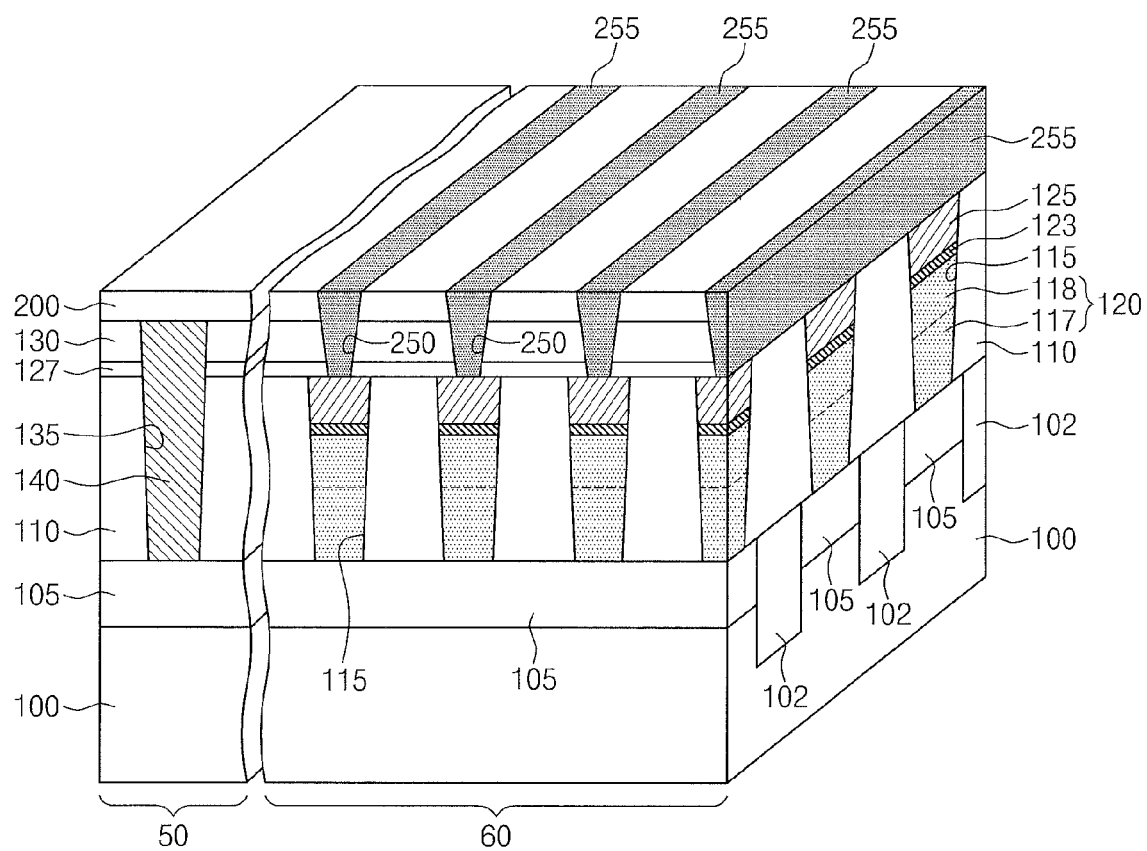

Referring to FIG. 10C, a variable resistance material layer may be formed over the entire surface of the substrate 100 to fill the mold openings 250, and the variable resistance material layer may be planarized until the second mold dielectric layer 200 is exposed so as to form variable resistors 255 in the mold openings 250. In example embodiments, when the variable resistance material layer is planarized, an upper portion of the second mold dielectric layer 200 may be etched.

Therefore, the thickness of the second mold dielectric layer 200 may be reduced after the planarization process. The upper surfaces of the variable resistors 255 may be disposed substantially at the same level as the upper surface of the second mold dielectric layer 200 by the planarization process. In example embodiments, as shown in FIG. 10C, the mold openings 250 may have a groove shape, and the variable resistors 255 may have a line shape extending in one direction.

Alternatively, as shown in FIG. 9D, each of mold openings 250a may have a hole shape, and each of variable resistors 255a may be pillar-shaped in the hole-shaped mold openings 250a.

In example embodiments, as shown in FIG. 9C, upper surfaces of the variable resistors 255r may be disposed at a level lower than the upper surface of the second mold dielectric layer 200 by an over-etching process of the planarization process and/or include an additional recess process.

Figure 10D:
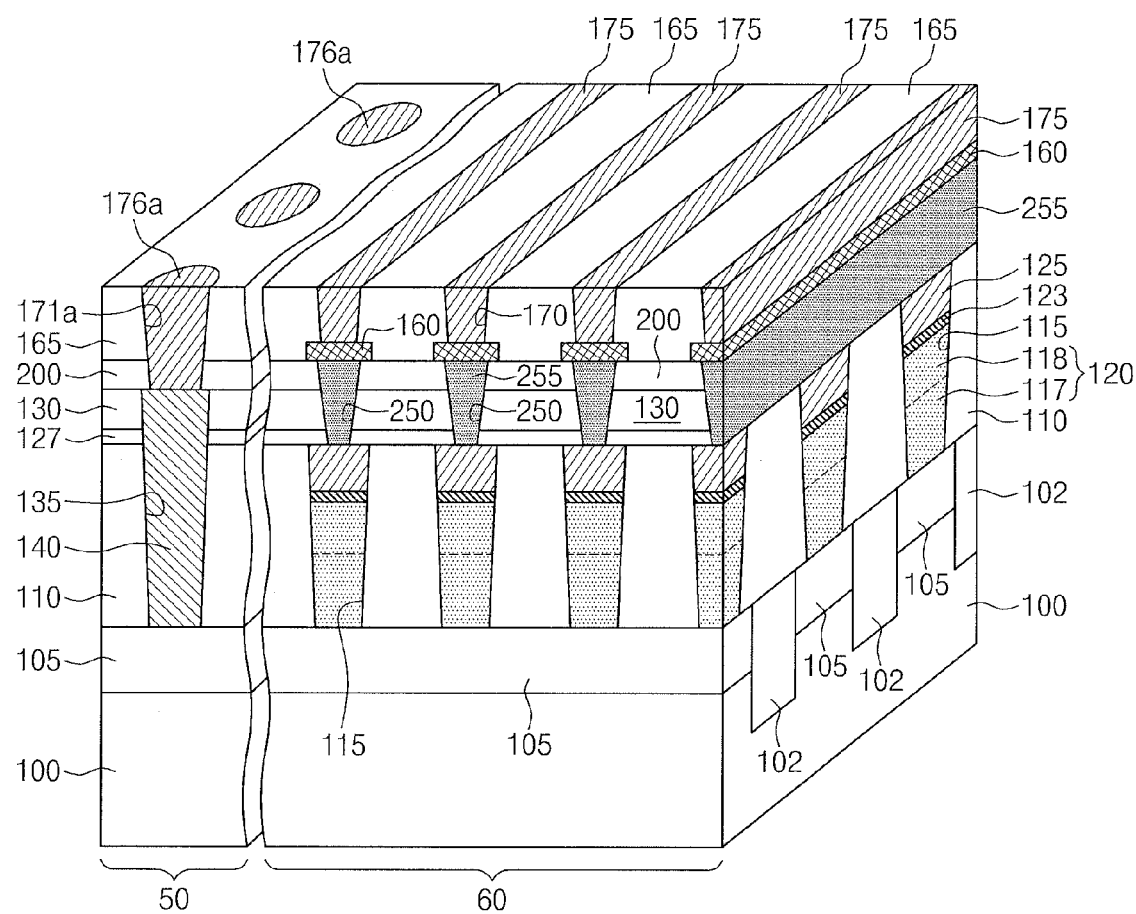

Referring to FIG. 10D, a first upper interlayer dielectric layer 165 may be formed over the entire surface of the substrate 100. Second contact holes 171a may be formed by sequentially patterning the first upper interlayer dielectric layer 165 and the second mold dielectric layer 200 in the first region 50. The upper surfaces of the first contact plugs 140 may be exposed by the second contact holes 171a, respectively. Upper openings 170 may be formed by patterning the first upper interlayer dielectric layer 165 in the second region 60. The upper electrodes 160 may be exposed by the upper openings 170, respectively. The second contact holes 171a and the upper openings 170 may be simultaneously formed.

In example embodiments, a portion of the upper surface of the first contact plug 140 may be exposed by the second contact hole 171a. Even after the second contact holes 171a are formed, the upper surfaces of the first contact plugs 140 may be disposed substantially at the same level as the upper surface of the first mold dielectric layer 130.

Alternatively, as shown in FIG. 9A, the first portion 139a of the upper surface of the first contact plug 140 exposed by the second contact hole 171a may be recessed downward from the second portion 139b of the upper surface of the first contact plug 140 not exposed by the second contact hole 171a. In example embodiments, the first portion 139a may be recessed by an additional recess process and/or an over-etching process included in the etching process of the second contact holes 171a.

Alternatively, as shown in FIG. 9B, the entire upper surface of the first contact plug 140 may be exposed by the second contact hole 171a', and the entire upper surface of the first contact plug 140 may be recessed. In example embodiments, the entire upper surface of the first contact plugs 140 may be recessed by an additional recess process and/or an over-etching process included in the etching process of the second contact hole 171a'.

As shown in FIG. 10D, the upper openings 170 may have a groove shape extending in one direction. Alternatively, as shown in FIG. 9D, each of upper openings 170a may have a hole shape.

Referring to FIG. 10D, a conductive layer may be formed to fill the second contact holes 171a and the upper openings 170, and the second conductive layer may be planarized until the first upper interlayer dielectric layer 165 is exposed, so as to form second contact plugs 176a in the second contact holes 171a and buried electrodes 175 in the upper openings 170. As shown in FIG. 10D, if the upper openings 170 have a groove shape, the buried electrodes 175 may have a line shape. Alternatively, if the upper openings 170 have a hole shape (refer to the upper openings 170a shown in FIG. 9D), the buried electrodes 175 may have a plug shape (refer to the buried electrodes 175a shown in FIG. 9D). The next processes (e.g., processes of forming bit lines 180 and landing pads 181) are equal to the processes explained with reference to FIG. 3J and FIG. 1.

According to the above-described semiconductor memory device of example embodiments, the second mold dielectric layer 200 may be formed over the entire surface of the substrate 100 after the first contact plugs 140 are formed, and the mold openings 250 may be formed sequentially through the second mold dielectric layer 200, the first mold dielectric layer 130, and the etch stop layer 127 in the second region 60. Therefore, when the mold openings 250 are formed, the first contact plugs 140 can be protected by the second mold dielectric layer 200. As a result, while the mold openings 250 are formed, metal atoms may be prevented or reduced from moving toward the mold openings 250 from the first contact plugs 140. Thus, the semiconductor memory device can be highly optimized and integrated and be reliably operated.

The semiconductor memory devices of the above embodiments can be included in various semiconductor packages. For example, the semiconductor memory devices of the embodiments may be packaged in various forms, for example, Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

Packages including the semiconductor memory devices of example embodiments of the inventive concepts may include logic devices and/or controllers for controlling the semiconductor memory devices.

Figure 11:
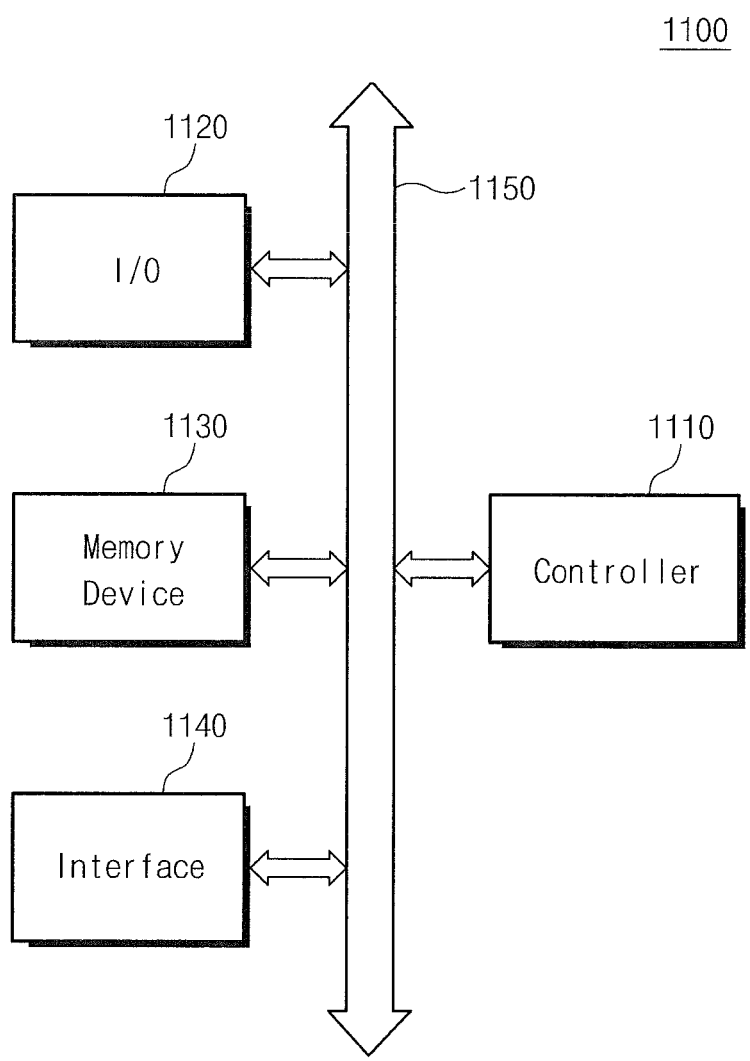
FIG. 11 is a block diagram illustrating an exemplary electronic system including a semiconductor memory device according to example embodiments of the inventive concepts.

FIG. 11 is a block diagram illustrating an example electronic system 1100 including a semiconductor memory device according to example embodiments of the inventive concepts.

Referring to FIG. 11, the electronic system 1100 of example embodiments may include a controller 1110, an input/output device 1120, a memory device 1130, an interface 1140, and a bus 1150. The controller 1110, the input/output device 1120, the memory device 1130, and/or the interface 1140 may be coupled to each other through the bus 1150. The bus 1150 may be a data transmission path.

The controller 1110 may include at least one of a microprocessor, a digital signal processor, a microcontroller, and a logic device having a function similar to those of these devices. The input/output device 1120 may include a keypad, a keyboard, and a display device. The memory device 1130 may store data and/or commands. The memory device 1130 may include at least one of the semiconductor memory devices of the above example embodiments. In addition, the memory device 1130 may further include another kind of semiconductor memory device, for example, a dynamic random access memory (DRAM) and/or a static random access memory (SRAM). The interface 1140 may transmit or receive data to and from a communication network. The interface 1140 may be a wire or wireless interface. For example, the interface 1140 may include an antenna or a wire/wireless transceiver. The electronic system 1100 may further include an operation memory device (not shown), for example, a high-speed DRAM and a high-speed SRAM for improving operations of the controller 1110.

The electronic system 1100 may be applied to a personal digital assistant (PDA), a portable computer, a web tablet, a wireless phone, a mobile phone, a digital music player, a memory card, or any other devices capable of wirelessly receiving and transmitting data.

Figure 12:
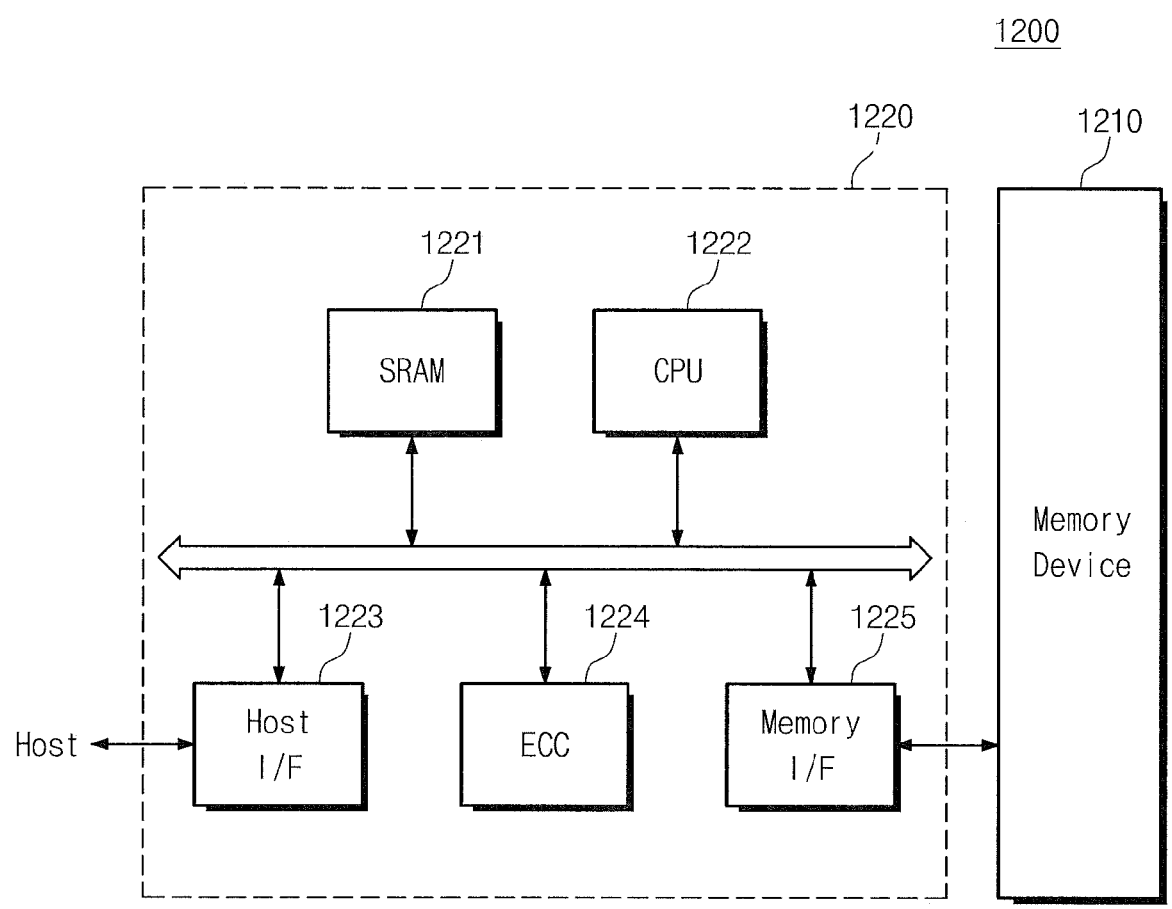
FIG. 12 is a block diagram illustrating an exemplary memory card including a semiconductor memory device according to example embodiments of the inventive concepts.

FIG. 12 is a block diagram illustrating an example memory card 1200 including a semiconductor memory device according to example embodiments of the inventive concepts. Referring to FIG. 12, the memory card 1200 of example embodiments includes a memory device 1210. The memory device 1210 may include at least one of the semiconductor memory devices of the above example embodiments. In addition, the memory device 1210 may further include another kind of semiconductor memory device (e.g., a DRAM and/or an SRAM). The memory card 1200 of example embodiments may include a memory controller 1220 adapted to control overall data exchange between a host and the memory device 1210.

The memory controller 1220 may include a central processing unit (CPU) 1222 to control overall operations of the memory card 1200. In addition, the memory controller 1220 may include an SRAM 1221 as an operation memory of the CPU 1222. In addition, the memory controller 1220 may further include a host interface 1223 and a memory interface 1225. The host interface 1223 may include a data exchange protocol for data exchange between a host and the memory card 1200. The memory controller 1220 and the memory device 1210 may be connected through the memory interface 1225. Furthermore, the memory controller 1220 may further include an error correction coding (ECC) block 1224. The ECC block 1224 may detect errors from data read from the memory device 1210 and correct the errors. The memory card 1200 may further include a read only memory (ROM) (not shown) to store code data for interfacing with a host. The memory card 1200 may be used as a portable data storage card. In another example, the memory card 1200 may be configured as a solid state disk (SSD) that can be used instead of a hard disk of a computer system.

As described above, according to example embodiments, the capping patterns may be formed on the contact plugs before the mold openings are formed. In example embodiments, while the mold openings are formed, atoms can be prevented or reduced from moving from the contact plugs toward the mold openings. Thus, the semiconductor memory device can be highly optimized and integrated and be reliably operated.

According to example embodiments, the second mold dielectric layer may be formed on the first mold dielectric layer and the contact plugs, and the variable resistors may be disposed in the mold openings formed in the second region through the second mold dielectric layer and the first mold dielectric layer. In example embodiments, while the mold openings are formed, the second mold dielectric layer may prevent or reduce atoms from moving toward the mold openings from the contact plugs. Thus, the semiconductor memory device can be highly optimized and integrated and be reliably operated.

The above-disclosed subject matter is to be considered illustrative and not restrictive, and the appended claims are intended to cover all such modifications, enhancements, and other embodiments, which fall within the true spirit and scope of the inventive concepts. Thus, to the maximum extent allowed by law, the scope of the inventive concepts is to be determined by the broadest permissible interpretation of the following claims and their equivalents, and shall not be restricted or limited by the foregoing detailed description.

What is claimed is:
1. A semiconductor memory device comprising:
a mold dielectric layer on an entire surface of a substrate, the substrate including a first region and a second region;
a first contact plug in a contact hole formed through the mold dielectric layer in the first region, the first contact plug having an upper surface at a level substantially equal to or lower than an upper surface of the mold dielectric layer;
a variable resistor in a mold opening formed through the mold dielectric layer in the second region;
an upper interlayer dielectric layer on the mold dielectric layer; and a second contact plug formed through the upper interlayer dielectric layer in the first region, the second contact plug making direct contact with the upper surface of the first contact plug.

2. The semiconductor memory device of claim 1, wherein the upper surface of the first contact plug is at a level higher than a bottom surface of the mold dielectric layer.

3. The semiconductor memory device of claim 1, wherein an upper surface of the variable resistor is at a level substantially equal to or lower than the upper surface of the mold dielectric layer and higher than a bottom surface of the mold dielectric layer.

4. The semiconductor memory device of claim 1, further comprising:
a lower interlayer dielectric layer between the mold dielectric layer and the substrate; and
a lower electrode in a lower hole formed through the lower interlayer dielectric layer in the second region,
wherein the variable resistor makes contact with an upper surface of the lower electrode, and
wherein the contact hole extends downward to penetrate the lower interlayer dielectric layer in the first region, and the first contact plug extends downward to fill a portion of the contact hole penetrating the lower interlayer dielectric layer.

5. The semiconductor memory device of claim 4, further comprising:
a selective diode in the lower hole,
wherein the lower electrode is on the selective diode.

6. The semiconductor memory device of claim 4, further comprising:
an etch stop layer between the mold dielectric layer and the lower interlayer dielectric layer,
wherein the contact hole is formed sequentially through the mold dielectric layer, the etch stop layer, and the lower interlayer dielectric layer in the first region, and
wherein the mold opening is formed sequentially through the mold dielectric layer and the etch stop layer in the second region.

7. The semiconductor memory device of claim 1,
wherein the upper surface of the first contact plug includes a first portion making contact with the second contact plug and a second portion not making contact with the second contact plug, and
wherein the first portion is at a level lower than the second portion, and the second portion is at the same level as the upper surface of the mold dielectric layer.

8. The semiconductor memory device of claim 1, wherein the entire upper surface of the first contact plug makes contact with the second contact plug, and
wherein the entire upper surface of the first contact plug is at a level lower than the upper surface of the mold dielectric layer.

9. The semiconductor memory device of claim 1, further comprising:
an upper electrode between an upper surface of the variable resistor and the upper interlayer dielectric layer in the second region; and
a buried electrode in an upper opening formed through the upper interlayer dielectric layer in the second region, the buried electrode being connected to the upper electrode.

10. The semiconductor memory device of claim 9, wherein the upper surface of the variable resistor is at a level lower than the upper surface of the mold dielectric layer, and
wherein the upper electrode extends to fill a portion of the mold opening higher than the upper surface of the variable resistor.

11. The semiconductor memory device of claim 1, further comprising:
a capping pattern on a portion of the upper surface of the first contact plug,
wherein the upper surface of the first contact plug is at a level lower than the upper surface of the mold dielectric layer, and
an upper surface of the capping pattern is substantially at the same level as the upper surface of the mold dielectric layer.

12. The semiconductor memory device of claim 11, wherein the capping pattern comprises a metal oxide, and the first contact plug comprises the same metal as that included in the capping pattern.

13. The semiconductor memory device of claim 1, wherein the second contact plug has a lower surface at a level substantially equal to or lower than the upper surface of the mold dielectric layer.

* * * * *